(12) United States Patent
Kim et al.

(10) Patent No.: US 11,681,331 B2
(45) Date of Patent: Jun. 20, 2023

(54) DISPLAY DEVICE

(71) Applicant: Samsung Display Co., Ltd., Yongin-si (KR)

(72) Inventors: Taechang Kim, Yongin-si (KR);
Hyeryoung Park, Yongin-si (KR);
Sanghyo Park, Yongin-si (KR);
Hyunbin Park, Yongin-si (KR);
Soyoun Jung, Yongin-si (KR);
Chanhui Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 16 days.

(21) Appl. No.: 17/393,884

(22) Filed: Aug. 4, 2021

(65) Prior Publication Data
US 2022/0155825 A1 May 19, 2022

(30) Foreign Application Priority Data
Nov. 13, 2020 (KR) .................... 10-2020-0152283

(51) Int. Cl.
| | |
|---|---|
| *G06F 1/16* | (2006.01) |
| *H04M 1/02* | (2006.01) |
| *H01L 51/52* | (2006.01) |
| *H10K 50/87* | (2023.01) |
| *H10K 102/00* | (2023.01) |

(52) U.S. Cl.
CPC .......... *G06F 1/1656* (2013.01); *G06F 1/1652* (2013.01); *H01L 51/529* (2013.01); *H04M 1/0214* (2013.01); *H04M 1/0268* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 7,515,406 B2 | 4/2009 | Kee et al. | |
| 8,827,536 B2 | 9/2014 | Lee et al. | |
| 10,448,521 B2* | 10/2019 | Seo ..................... | H05K 7/20954 |
| 11,348,488 B2* | 5/2022 | Jang ..................... | H04M 1/0268 |
| 2018/0014417 A1* | 1/2018 | Seo ........................ | H05K 1/189 |
| 2022/0075411 A1* | 3/2022 | Lee ......................... | G06F 1/1616 |
| 2022/0155825 A1* | 5/2022 | Kim ....................... | H01L 51/529 |

FOREIGN PATENT DOCUMENTS

| | | |
|---|---|---|
| CN | 110853520 | 2/2020 |
| KR | 10-1212172 | 12/2012 |
| KR | 10-1400284 | 5/2014 |
| KR | 10-2019-0003257 | 1/2019 |

* cited by examiner

*Primary Examiner* — Lisa Lea-Edmonds
(74) *Attorney, Agent, or Firm* — Kile Park Reed & Houtteman PLLC

(57) ABSTRACT

A display device includes a display panel including a first area of a constant shape, and at least one shock absorber located on a surface of the first area of the display panel, the at least one shock absorber supporting the display panel, wherein the at least one shock absorber includes a first member located on the first area of the display panel, and a second member facing the first member. The second member is connected to the first member and disposed only on a part of the first member.

27 Claims, 15 Drawing Sheets

DISPLAY DEVICE

CROSS-REFERENCE TO RELATED APPLICATION(S)

This application claims priority to and benefits of Korean Patent Application No. 10-2020-0152283 under 35 U.S.C. § 119, filed on Nov. 13, 2020, in the Korean Intellectual Property Office, the entire contents of which are incorporated herein by reference.

BACKGROUND

1. Technical Field

One or more embodiments relate to a device, and, to a display device.

2. Description of the Related Art

Recently, mobile electronic devices have become widely used. Tablet PCs, as well as small-sized electronic devices such as mobile phones, have been widely used as portable electronic devices recently.

Such portable electronic devices include a display device that supports various functions and that provides a user with visual information such as images or videos. Recently, as the size of components for driving a display device has been reduced, the relevance of the display device in an electronic device has gradually increased, and a structure that may be bent by a predetermined angle from a flat state has been developed.

In case that a display device collides with another object, a display panel of the display device may be damaged.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In general, in case that an object collides with a display panel of a display device, dark spots where some or a number of pixels of the display panel may not operate may occur. One or more embodiments include a display device having a structure that absorbs an impact during a collision with an object.

Additional aspects will be set forth in part in the description which follows and, in part, will be apparent from the description, or may be learned by practice of the presented embodiments of the disclosure.

According to an embodiment, a display device may include a display panel including a first area of a constant shape; and at least one shock absorber located on a surface of the first area of the display panel, the at least one shock absorber supporting the display panel, wherein the at least one shock absorber may include a first member located on the first area of the display panel; and a second member facing the first member, the second member being connected to the first member and disposed only on a part of the first member.

The display device may further include a heat dissipating plate disposed between the at least one shock absorber and the display panel.

The heat dissipating plate and the first member of the at least one shock absorber may be integral with each other.

The heat dissipating plate may include a first heat dissipating plate disposed on a surface of the display panel; and a plurality of second heat dissipating plates spaced apart from one another and disposed on the first heat dissipating plate.

The at least one shock absorber may include a plurality of shock absorbers, and the plurality of shock absorbers may respectively correspond to the plurality of second heat dissipating plates.

The first heat dissipating plate may include a deformation structure at a bending portion of the display panel.

The at least one shock absorber may further include a third member facing the first member and the second member, the third member being connected to the second member.

The at least one shock absorber may further include a spacer disposed on a surface of the first member.

The second member may be a closed loop in a plan view.

The second member and the first member may be integral with each other, and the second member may be bent from the first member.

A surface of the first member may be spaced apart from a surface of the second member.

The second member may include a first side member located in a first direction; and a second side member spaced apart from the first side member and located in a second direction.

According to an embodiment, a display device may include a display panel; a heat dissipating plate disposed on a surface of the display panel and connected to the display panel; and a shock absorber facing the display panel with the heat dissipating plate disposed between the shock absorber and the display panel, the shock absorber being disposed on a surface of the heat dissipating plate, wherein the surface of the heat dissipating plate may be different from another surface of the heat dissipating plate connected to the display panel.

The display device may further include a panel protective member disposed between the heat dissipating plate and the display panel.

The display device may further include an optical functional layer disposed on the display panel.

The display device may further include a cover member disposed on the display panel.

The heat dissipating plate may include a first heat dissipating plate connected to the display panel; and a second heat dissipating plate that may be disconnected and separated at a region of a bending axis of the display device to be connected to the first heat dissipating plate.

The heat dissipating plate may include a deformation structure that is folded or unfolded.

The shock absorber may not overlap the deformation structure of the heat dissipating plate.

The shock absorber may further include a first member located on a first area of the display panel; and a second member facing the display panel and the first member, the second member being connected to the first member and disposed only on a part of the first member.

According to an embodiment, a display device may include a display panel including an unfolded first area; and a second area connected to the first area, the second area being foldable or rollable; a heat dissipating plate connected to the display panel, the heat dissipating plate comprising a portion corresponding to the unfolded first area; and a deformation structure corresponding to the second area; and a shock absorber located on the portion of the heat dissipating plate corresponding to the unfolded first area.

The unfolded first area may include two first areas spaced apart from each other with the second area disposed between the two first areas, and the shock absorber may be disconnected and correspond to the two first areas of the unfolded first area.

The shock absorber may include a portion corresponding to a boundary of the unfolded first area, the portion of the shock absorber protruding in a direction away from the display panel.

The shock absorber may include a space in the shock absorber.

The heat dissipating plate may include a first heat dissipating plate connected to the display panel; and a second heat dissipating plate that is disconnected and separated at a region of a bending axis of the display device to be connected to the first heat dissipating plate.

The display device may further include a panel protective member disposed between the heat dissipating plate and the display panel.

The display device may further include a cover member disposed on the display panel.

Other aspects, features and advantages of the disclosure will become better understood through the accompanying drawings, the claims and the detailed description.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
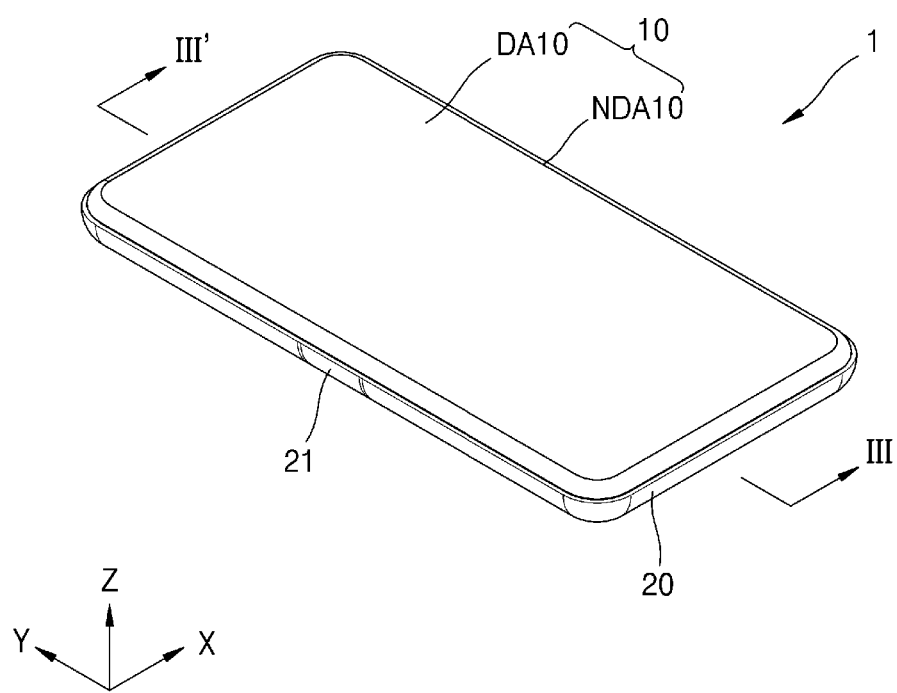
FIG. 1 is a perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or."

As the disclosure allows for various changes and numerous embodiments, embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another. For example, a first element may be referred to as a second element, and similarly, a second element may be referred to as a first element without departing from the scope of the disclosure.

An expression used in the singular encompasses the expression of the plural, unless it has a clearly different meaning in the context.

In the specification, it is to be understood that the terms "including," "having," and "comprising" and variations thereof are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Sizes of components in the drawings may be exaggerated for convenience of explanation. In other words, since sizes and thicknesses of components in the drawings may be arbitrarily illustrated for convenience of explanation, the following embodiments are not limited thereto.

The phrase "in a plan view" means viewing the object from the top, and the phrase "in a schematic cross-sectional view" means viewing a cross-section of which the object is vertically cut from the side.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a given process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
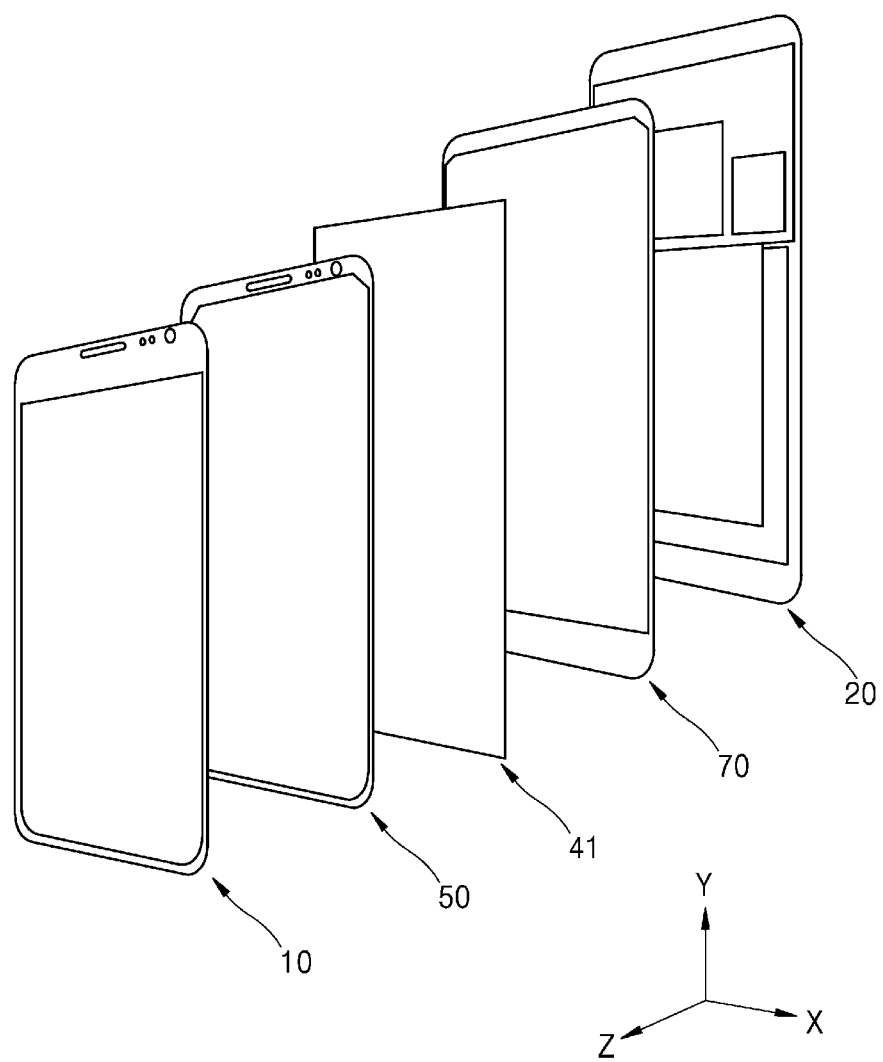
FIG. 2 is an exploded perspective view of a display device according to an embodiment.
Figure 3A:
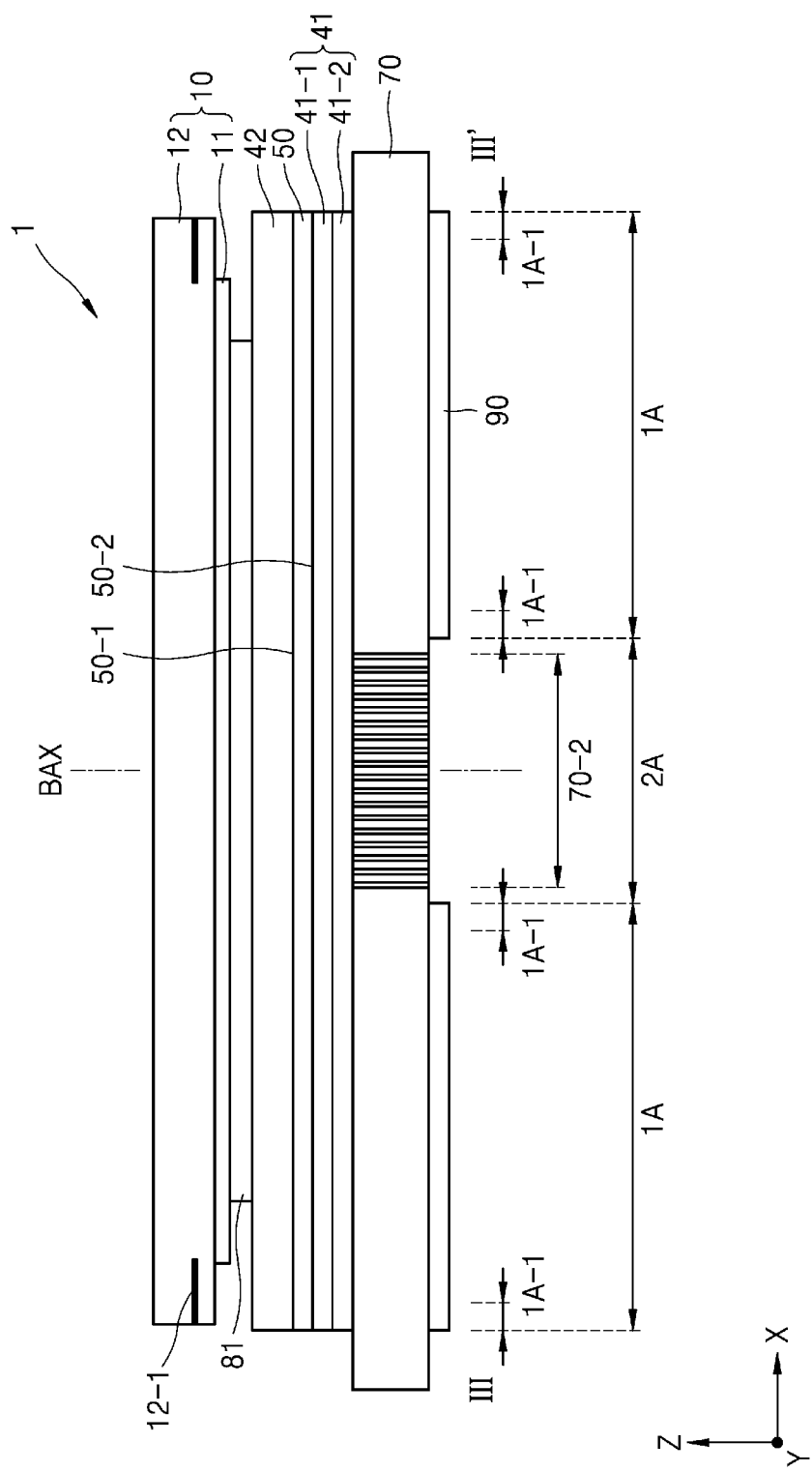
FIG. 3A is a schematic cross-sectional view partially showing a display device taken along line III-III' of FIG. 1 according to an embodiment.

FIG. 1 is a perspective view of a display device 1 according to an embodiment. FIG. 2 is an exploded perspective view of the display device 1 according to an embodiment. FIG. 3A is a schematic cross-sectional view showing a part of the display device 1 taken along line III-III' of FIG. 1 according to an embodiment.

Referring to FIGS. 1 to 3A, the display device 1 is a device for displaying video or still images and may be used as a portable electronic device such as a mobile phone, a smartphone, a tablet personal computer (PC), a mobile communication terminal, an electronic notebook, an electronic book, a portable multimedia player (PMP), a navigation terminal, an ultra-mobile PC (UMPC), for example, and also as a display screen in various products such as a television, a laptop computer, a monitor, a billboard, internet of things (IoT), for example. Also, the display device 1 may be used in wearable devices such as a smart watch, a watch phone, a glasses-type display, and a head mounted display (HMD). The display device 1 may be used in a dashboard of a vehicle, a center information display in a center fascia or dashboard of a vehicle, a rear-view mirror display that replaces a side-view mirror of a vehicle, and a display in a rear side of a front seat as an entertainment for the back seat in a vehicle. FIGS. 1 and 2 show that the display device 1 is used as a smartphone, for convenience of description.

The display device 1 may include a cover member 10, a display panel 50, a display circuit board (not shown), a heat dissipating plate 70, a display driver (not shown), a touch sensor driver (not shown), a main circuit board (not depicted), a battery (not shown), a lower cover 20, and a shock absorber 90.

Hereinafter, "upper portion" denotes a direction in which the cover member 10 is located or disposed based on the display panel 50, that is, +z direction, and "lower portion" denotes a direction in which the lower cover 20 is located or disposed based on the display panel 50, that is, −z direction. Also, "left", "right", "up", and "down" denote directions when the display panel 50 is seen in a plan view. For example, the left direction denotes −x direction, the right direction denotes +x direction, the upper direction denotes +y direction, and the lower direction denotes −y direction.

The display device 1 may have a substantially rectangular shape in a plan view. For example, the display device 1 may have a substantially rectangular plane shape having short sides in a first direction (x direction) and long sides in a second direction (y direction) as shown in FIG. 1. Corners, where the short sides in the first direction (x direction) and the long sides in the second direction (y direction) meet each other, may be rounded to have a curvature or may be right-angled or substantially right-angled. The substantially planar shape of the display device 1 is not limited to the substantially rectangular shape, but may have another substantially polygonal shape, a substantially elliptical shape, or a non-defined shape.

The display device 1 as above may have various shapes. For example, the display device 1 may have a shape that may not be variable. In an embodiment, the display device 1 may be at least partially folded. The display device 1 may be an in-folding type, in which a display area of the display panel 50 is folded in half and halves of the display area face each other in case that the display device 1 is folded, or an out-folding type in which the display area of the display panel 50 is exposed to the outside in case that the display device 1 is folded. In an embodiment, the display device 1 may have a partially rolling portion. Hereinafter, a case in which the display device 1 is the in-folding type will be described below.

In the above case, the display device 1 may be folded about a bending axis BAX. In case that the display device 1 is folded about the bending axis BAX, a size of the display device 1 may be reduced. In case that the display device 1 is completely unfolded, the display area forms a flat surface and displays an image to realize a large screen.

Here, the display device 1 may include first areas 1A having fixed or constant shapes, and a second area 2A connected to the first areas 1A and folding or unfolding. Here, the first and second areas 1A and 2A may display images. The first areas 1A may not be bent, but may provide images on flat surfaces. Also, the second area 2A connects the first areas 1A to each other and at the same time may be folded, so that the first areas 1A may be at opposite sides. In case that the display device 1 is folded, images may be provided from opposite surfaces of the display device 1. On the contrary, in case that the display device 1 is unfolded, the display device 1 may provide an image only on one of the opposite surfaces.

The cover member 10 may be disposed on the display panel 50 so as to cover or overlap an upper surface of the display panel 50. As such, the cover member 10 may protect the upper surface of the display panel 50.

The cover member 10 may include a transmitting cover DA10 corresponding to the display panel 50 and a light-shielding cover NDA10 corresponding to other areas than the display panel 50. The light-shielding cover NDA10 may include an opaque material that shields the light. The light-shielding cover NDA10 may include a pattern that may be seen to a user in case that the image may not be displayed.

The cover member 10 may include a cover window 11 and a protective member 12. The cover window 11 may include a transparent material. Here, the cover window 11 may include glass, a synthetic resin including a transparent material, for example. The cover window 11 may include at least one layer or a layer. The protective member 12 may be disposed on an upper surface of the cover window 11 so as to prevent scratches from occurring in case that a force is applied to the cover window 11. An opaque layer 12-1 may be disposed in a part of the protective member 12. The opaque layer 12-1 may be disposed at an edge of the protective member 12. The opaque layer 12-1 may block the light and may include a light-blocking layer that will be described later.

The display panel 50 may be disposed under or below the cover member 10. The display panel 50 may overlap the transmission cover DA10 of the cover member 10. The display panel 50 may include a first surface 50-1 on which the display area may be located or disposed and a second surface 50-2 that is opposite to the display area. Here, the first surface 50-1 may provide an image, and the second surface 50-2 may not provide an image. In an embodiment, the first surface 50-1 may provide the image on most of the first surface 50-1 (for example, about 50% or greater of an area of the first surface 50-1), and the second surface 50-2 may provide an image only on a part of the second surface 50-2. Hereinafter, a case in which the image is only provided on the first surface will be described below for convenience of description.

The display panel 50 may include a display area DA and a peripheral area NDA. The display area DA may denote a region of displaying an image, and the peripheral area NDA may denote a region on which the image may not be displayed (refer to FIG. 4A).

The display panel 50 may be a light-emitting display panel including a light-emitting element. For example, the display panel 50 may include an organic light-emitting display panel using an organic light-emitting diode including an organic light-emitting layer, a micro-LED display panel using a micro-LED, a quantum dot light-emitting display panel using a quantum dot light-emitting diode including a quantum dot light-emitting layer, or an inorganic light-emitting display panel using an inorganic light-emitting device including an inorganic semiconductor.

An optical functional layer 42 may be disposed on a touch-screen layer of the display panel 50. The optical functional layer 42 may include an anti-reflection layer. The anti-reflection layer may reduce a reflectivity of light (external light) incident to the display device 1 from outside.

In an embodiment, the anti-reflection layer may include a polarization film. The polarization film may include a linear polarization plate and a phase retardation film such as a λ/4 (quarter-wave) plate. The phase retardation film may be disposed on the touch-screen layer, and the linear polarization plate may be disposed on the phase retardation plate.

In an embodiment, the anti-reflection layer may include a filter layer including a black matrix and color filters. The color filters may be arranged or disposed taking into account a color of light emitted from each of the pixels in the display device 1. For example, the filter layer may include a red, a green, or a blue color filter or color filters.

In an embodiment, the anti-reflection layer may include a destructive interference structure. The destructive interference structure may include a first reflective layer and a second reflective layer arranged or disposed on different layers. First reflected light and second reflected light that are respectively reflected by the first reflective layer and the second reflective layer may be destructively interfered with each other, and accordingly a reflectivity of external light may be reduced.

The cover member 10 may be disposed on the optical functional layer 42. The cover member 10 may be attached onto the optical functional layer 42 by a transparent adhesive member such as an optically clear adhesive (OCA) film.

A panel protective member 41 may be disposed under or below the display panel 50. The panel protective member 41 may be attached to a lower surface of the display panel 50 via an adhesive member. The adhesive member may include a pressure sensitive adhesive (PSA). The panel protective member 41 may include at least one of a light-absorbing layer 41-1 for absorbing light incident from outside, a cushion layer 41-2 for absorbing shock from outside, and a heat dissipation layer for effectively discharging heat from the display panel 50.

The light-absorbing layer 41-1 may be disposed under or below the display panels 50. The light-absorbing layer 41-1 may prevent the light transmission such that elements under or below the light-absorbing layer, for example, the display circuit board, etc., may be prevented from being visible from above the display panel 50. The light-absorbing layer 41-1 may include a light-absorbing material such as a black pigment or a black dye. Hereinafter, an example in which the panel protective member 41 may include the light-absorbing layer 41-1 and the cushion layer 41-2 will be described in detail for convenience of description.

A first flexible film may be disposed in the peripheral area NDA at one edge or an edge of the display panel 50. The first flexible film may be substantially curved to a lower portion of the display panel 50, and the display circuit board may be disposed on a lower surface of the panel protective member 41. The display circuit board may be attached and fixed onto the lower surface of the panel protective member 41. The adhesive member may include the pressure sensitive adhesive.

The heat dissipating plate 70 may be disposed under or below the panel protective member 41. The heat dissipating plate 70 may transfer the heat generated from at least one of the display panel 50 and a digitizer. The heat dissipating plate 70 may include a metal having an excellent heat transfer efficiency.

The heat dissipating plate 70 may include a deformation structure 70-2. Here, the deformation structure 70-2 may be formed as a substantially concavo-convex structure. In an embodiment, the deformation structure 70-2 may be of a chained type. In an embodiment, the deformation structure 70-2 may have a shape, in which members having substantially triangular cross-sections may be connected to one another. The deformation structure 70-2 may include all kinds of foldable shapes. Here, the heat dissipating plate 70 may have a thin-film shape including at least one from a metal having a high thermal conductivity, for example, copper, nickel, ferrite, silver, etc., graphite, and a carbon nanotube.

A digitizer (not shown) may be disposed under or below the display panel 50. Here, the digitizer may include a pattern layer so as to sense a signal input from an external electronic pen, for example. The digitizer may sense an intensity, a direction, for example, of the signal input from the electronic pen, for example. The digitizer may be electrically connected to the main circuit board. Here, in case that the digitizer is provided, the digitizer may be disposed between the heat dissipating plate 70 and the panel protective member 41.

In case that the digitizer is disposed on the display panel, a bracket (not depicted) for supporting the display panel 50 may be disposed under or below the digitizer. The bracket may include plastic, metal, or both plastic and metal.

In case that the bracket as above is provided, the heat dissipating plate 70 may be disposed on the bracket. Here, the heat dissipating plate 70 may be connected or coupled to the bracket or the heat dissipating plate 70 and the bracket may be integral with each other.

The shock absorber 90 may be disposed under or below the heat dissipating plate 70. Here, the shock absorber 90 may be located or disposed only in the first areas 1A. The shock absorber 90 may partially absorb the shock applied to the display panel 50, in case that an object, for example, falls onto the display panel 50.

In detail, in case that an object, for example, falls onto the display device 1 or a user applies excessive force onto the display device 1, an impact may be applied to the display panel 50. Various electrodes, thin-film transistors, wires, various layers, for example, in the display panel 50 may be damaged. Some or a number of a plurality of pixels in the display panel 50 may not emit light, and may not emit light to the outside according to the signal. For example, the display panel 50 may have dark spots, from which the light may not emit, on at least some or a number of portions or portion thereof. The shock absorber 90 partially absorbs the shock applied from outside in order to prevent the dark spots, and thus, transfer of the shock to the display panel 50 may be prevented. Moreover, the shock absorber 90 may absorb the shock applied to the main circuit board, for example, in case that the main circuit board, for example, is disposed on a bottom surface of the shock absorber 90.

The main circuit board and a battery (not shown) may be disposed under or below the shock absorber 90 or the bracket. The main circuit board may include a printed circuit board or a flexible printed circuit board.

The main circuit board may include a main processor (not shown), a camera device (not shown), a main connector (not shown), and components (not shown). The main processor may include an integrated circuit. The camera device may be disposed both on an upper surface and a lower surface of the main circuit board, and each of the main processor and the main connector may be disposed on one of the upper and lower surfaces of the main circuit board.

The main processor may control the overall functions of the display device 1. For example, the main processor may output digital video data to the display driver via the display circuit board, such that the display panel 50 may display an image. Also, the main processor may receive an input of sensing data from the touch sensor driver. The main processor may determine whether there is a touch of the user according to the sensing data, and may perform an operation corresponding to a direct touch or a proximate touch of the user. For example, the main processor calculates a touch coordinate of the user by analyzing the sensing data, and may execute an application or perform an operation indicated by an icon touched by the user. The main processor may include an application processor, a central processing unit, or a system chip including an integrated circuit.

The camera device may process image frames of a still image or a moving picture obtained by an image sensor in a camera mode, and outputs the processed result to the main processor. The camera device may include at least one of a camera sensor (for example, CCD, CMOS, etc.), a photo sensor (or image sensor), and a laser sensor. The camera device may be connected to the image sensor in the component overlapping a component area to process the image input to the image sensor.

A cable after passing through a cable hole of the bracket may be connected to the main connector, and thus, the main circuit board may be electrically connected to the display circuit board.

The main circuit board may further include, in addition to the main processor, the camera device, and the main connector, at least one of wireless communication units, at least one of input units, at least one of sensor units, at least one of output units, at least one of interface units, a memory, and a power supplier.

The wireless communication unit may include a broadcast receiving module, a mobile communication module, a near field communication module, and a position information module.

The broadcast receiving module receives a broadcast signal and/or broadcast-related information from an external broadcast management server via a broadcast channel. The broadcast channel may include satellite channels and terrestrial channels.

The mobile communication module transmits or receives a wireless signal to or from at least one of a base station, an external terminal, and a server on a mobile communication network established according to technology standards or communication methods for mobile communication (for example, global system for mobile communication (GSM), code division multi access (CDMA), CDMA2000, enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LED-A), for example) The wireless signal may include a voice call signal, a video call signal, or various types of data according to a transmission or reception of texts or multimedia messages.

The wireless Internet module denotes a module for accessing wireless Internet. The wireless Internet module may transmit or receive a wireless signal in a communication network according to wireless Internet technologies. The wireless Internet technology may include, for example, wireless LAN (WLAN), wireless-fidelity (Wi-Fi), Wi-Fi direct, digital living network alliance (DLNA), for example.

The short-range communication module may support short-range communication by using at least one selected from Bluetooth™, Radio Frequency Identification (RFID), Infrared Data Association (IrDA), Ultra Wideband (UWB), ZigBee, Near Field Communication (NFC), Wireless-Fidelity (Wi-Fi), Wi-Fi Direct, and Wireless Universal Serial Bus (USB). The short-range communication module may support wireless communication between the display device 1 and the wireless communication system, between the display device 1 and another electronic device, or between the display device 1 between a network in which another electronic device (or external server) may be located or disposed via wireless area networks. The wireless area network may include wireless personal area network. Another electronic device may include a wearable device that exchanges data (or is linkable) with the display device 1.

The position information module is for obtaining a location of the display device 1 (or current location), and examples of the position information module may include a global positioning system (GPS) module or Wi-Fi module. For example, the display device 1 may obtain the location of the display device 1 by using a signal sent from a GPS satellite, in a case of using the GPS module. Also, the display device 1 may obtain the location of the display device 1 based on information of a wireless access point (AP) transmitting or receiving a wireless signal to or from the Wi-Fi module, in a case of using the Wi-Fi module. The position information module may be used to obtain the location of the display device 1 (or current location) and is not limited to a module for directly calculating or obtaining the location of the display device 1.

The input unit may include an image input unit such as the camera device for input image signals, a sound input unit such as a microphone for inputting sound signals, and an input device for receiving input of information from the user.

The camera device may process image frames such as still images, moving pictures, for example, obtained by the image sensor in a video call mode or a photographing mode. The processed image frame may be displayed on the display panel 50 or stored in the memory.

The microphone processes a sound signal from outside as electrical voice data. The voice data may be variously used according to the function (or application being executed) performed by the display device 1. The microphone may use various noise canceling algorithms for canceling noise generated in case that receiving the sound signal from the outside.

The main processor may control operations of the display device 1 so as to correspond to information input through the input device. The input device may include a mechanical input unit such as a button located or disposed on a bottom surface or a side surface of the display device 1, a dome switch, a jog-wheel, a jog switch, for example, or a touch input unit. The touch input unit may include a touch screen layer of the display panel 50.

The sensor unit may include one or more sensors that sense at least one of information in the display device 1, peripheral environment information of the display device 1, and user information, and generates a sensing signal corresponding to the sensed information. The main processor may control driving or operation of the display device 1, may process data, or perform functions or operations regarding an application installed on the display device 1, based on the sensing signal. The sensor unit may include at least one selected from a proximity sensor, an illumination sensor, an acceleration sensor, a magnetic sensor, a G-sensor, a gyroscope sensor, a motion sensor, an RGB sensor, an infrared ray (IR) sensor, a finger scan sensor, an ultrasonic sensor, an optical sensor, a battery gauge, an environmental sensor (for example, a barometer, a hydrometer, a thermometer, a radiation detection sensor, a heat detection sensor, a gas detection sensor, etc.), and a chemical sensor (for example, an electronic nose, a healthcare sensor, a biometric sensor, etc.).

The proximity sensor denotes a sensor for sensing an existence of an object approaching a predetermined detect surface or an object around the detect surface by using an electromagnetic field or an infrared ray, without a physical contact. Examples of the proximity sensor may include a transmission type photoelectric sensor, a direct reflective photoelectric sensor, a mirror reflective photoelectric sensor, a radio frequency oscillation type proximity sensor, a capacitive type proximity sensor, a magnetic type proximity sensor, an infrared ray proximity sensor, for example. The proximity sensor may sense a proximity touch pattern such as a proximity touch distance, a proximity touch direction, a proximity touch speed, a proximity touch time, a proximity touch position, and a proximity touch movement, for example, as well as the proximity touch. The main processor processes data (or information) corresponding to the proximate touch operation or the proximate touch pattern sensed by the proximity sensor, and may control visual information corresponding to processed data to be displayed on the display panel 50.

The ultrasound sensor may recognize position information of an object. The main processor may calculate a position of an object through information sensed by the optical sensor and a plurality of ultrasound sensors. Because the speed of light and the speed of ultrasonic waves are different from each other, the position of the object may be calculated by using a time taken for the light to reach the optical sensor and a time for the ultrasonic wave to reach the ultrasound sensor.

The output unit generates an output related to visual, auditory, or tactile sense, and may include at least one selected from the display panel 50, a sound output unit, a haptic module, and an optical output unit.

The display panel 50 displays (outputs) information processed in the display device 1. For example, the display panel 50 may display information about an execution screen of an application executed on the display device 1 or a user interface (UI) or a graphical user interface (GUI) information according to the execution screen information. The display panel 50 may include a display layer for displaying the image and a touch screen layer for sensing a touch input from the user. As such, the display panel 50 may function as one of input devices providing an input interface between the display device 1 and the user, and at the same time, may function as one of output units providing an output interface between the display device 1 and the user.

The sound output unit may output sound data received from the wireless communication unit or stored in the memory in a call signal reception, a call mode or a recording mode, a voice recognition mode, a broadcast reception mode, for example. The sound output unit outputs a sound signal related to the function executed on the display device 1 (for example, a call signal reception sound, a message reception sound, etc.). The sound output unit may include a receiver and a speaker. At least one of the receiver and the speaker may be a sound generation device attached to a lower portion of the display panel 50 to vibrate the display panel 50 and output sound. The sound generation device may include a piezoelectric element or a piezoelectric actuator that contracts and expands according to an electric signal, or an exciter that generates a magnetic force by using a voice coil to vibrate the display panel 50.

The haptic module generates various tactile effects that the user may feel. The haptic module may provide the user with the vibration as the tactile effect. An intensity and pattern of the vibrations generated by the haptic module may be controlled by a selection of the user or a setting of the main processor. For example, the haptic module may synthesize and output different vibrations or sequentially output the different vibrations. The haptic module may generate various tactile effects, for example, arrangement of pins that move vertically to contact skin surface, air injection force or air suction force through an injection port or a suction port, grazing on the skin surface, contact of an electrode, effects caused by stimulation of electromagnetic force, effects caused by reproducing cooling and warming feeling by using endothermic or exothermic elements. The haptic module may be implemented such that the user may feel the tactile effect through muscle sensation such as a finger, an arm, for example, as well as the tactile effect through contact or direct contact.

The optical output unit outputs a signal for notifying an occurrence of an event by using the light from a light source. Examples of the event occurring on the display device 1 may include a message reception, a call signal reception, missed call, alarm, schedule notification, email reception, information reception through an application, for example. The signal output from the optical output unit may be realized in case that the display device 1 emits light of a single color or a plurality of colors through a front surface or a bottom surface. The signal output may be terminated in case that the display device 1 senses that the user identifies the event.

The interface unit performs as a path to various external devices electrically connected to the display device 1. The interface unit may include at least one selected from a wired or wireless headset port, an external charger port, a wired or wireless data port, a memory card port, a port for electrically connecting a device including an identification module, an audio input/output (I/O) port, a video I/O port, and an earphone port. The display device 1 may perform an appropriate control regarding an external device electrically connected thereto, in response to the electrical connection of the external device to the interface unit.

The memory stores data supporting various functions of the display device 1. The memory may store a plurality of application programs driven on the display device 1, data for operating the display device 1, and instructions. At least some or a number of the plurality of application programs may be downloaded from an external server via wireless communication. The memory may store an application for operating the main processor and may temporarily store input or output data, for example, data such as a phone book, messages, still images, videos, etc. Also, the memory may store haptic data for various patterns of vibrations provided to the haptic module and sound data about various sounds provided to the sound output unit. The memory may include at least one type of storage medium selected from a flash memory type, a hard disk type, a solid state disk (SSD) type, a silicon disk drive (SSD) type, a multimedia card micro type, a card type memory (for example, SD or XD memory, etc.), random access memory (RAM), static RAM (SRAM), read-only memory (ROM), electrically erasable programmable ROM (EEPROM), programmable ROM (PROM), a magnetic memory, a magnetic disk, and an optical disk.

The power supplier supplies electric power to each of elements included in the display device 1 by receiving external and internal power, under the control of the main processor. The power supplier may include the battery. Also, the power supplier may include a connection port, and the connection port may be implemented as an example of the interface unit to which the external charger supplying the electric power for charging the battery is electrically connected. For example, the power supplier may be implemented to charge the battery in a wireless manner without using the connection port. The battery may receive the electric power from an external wireless power transfer device by at least one of an inductive coupling method based on a magnetic induction phenomenon and a magnetic resonance coupling method based on an electromagnetic resonance phenomenon. The battery may be provided not to overlap the main circuit board in a third direction (z-direction). The battery may overlap a battery hole of the bracket.

The lower cover 20 may be disposed under or below the main circuit board and the battery. The lower cover 20 may be connected or coupled to the bracket to be fixed. The lower cover 20 may form a lower outer appearance of the display device 1. The lower cover 20 may include plastic, metal, or both the plastic and metal. The lower cover 20 may include a connection structure 21 in the second area 2A that is foldable. The connection structure 21 may have various shapes. For example, the connection structure 21 may be connected to the lower cover 20 in the first areas 1A in a hinged manner. In an embodiment, the connection structure 21 may be connected to the lower cover 20 in the first areas 1A to be rotatable. The connection structure 21 is not limited to the above example, and the connection structure 21 may include all kinds of structures that connect parts of the lower cover 20 in the first areas 1A so that the lower cover 20 is foldable.

The display device 1 as above may include an adhesive layer (not depicted). For example, a first adhesive layer 81 may be between the cover member 10 and the optical functional layer 42. A second adhesive layer (not shown) may be between the panel member 50 and the panel protective member 41. A third adhesive layer (not shown) may be between the panel protective member 41 and the heat dissipating plate 70. The third adhesive layer may be divided and separated. Here, the bending axis BAX may be in a separate portion in the third adhesive layer or a region where the third adhesive layer may not be provided. Because the third adhesive layer may not be disposed on the portion where the bending axis BAX may be located or disposed, the third adhesive layer may not interfere with the folding or unfolding of the display device 1.

Figure 3B:
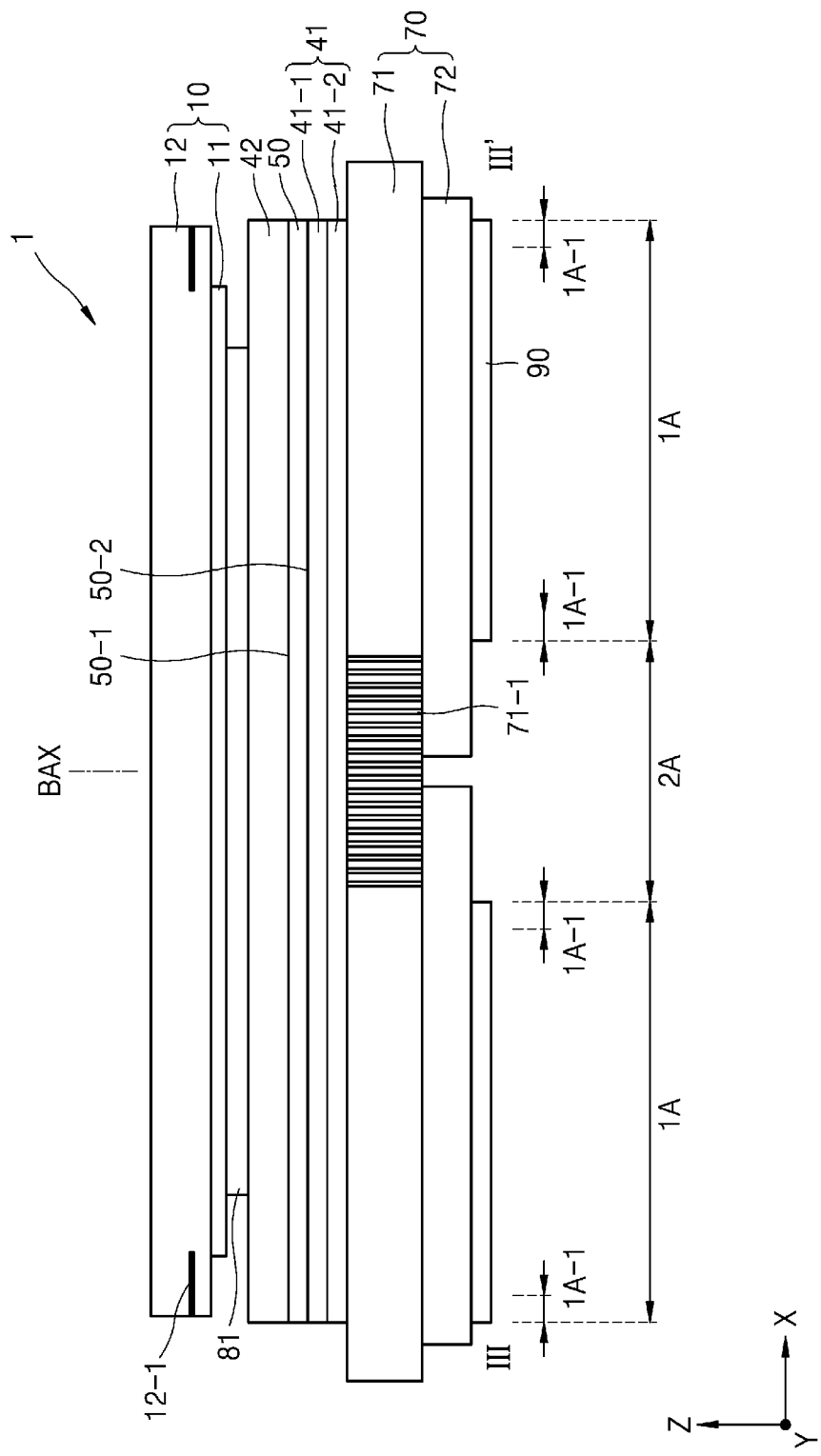
FIG. 3B is a schematic cross-sectional view partially showing a display device taken along line III-III' of FIG. 1 according to an embodiment.

FIG. 3B is a schematic cross-sectional view showing a part of the display device 1 taken along line of FIG. 1 according to an embodiment.

Referring to FIG. 3B, the display device 1 may be similar to that of FIGS. 1 to 3A. Hereinafter, differences from the display device described above with reference to FIGS. 1 to 3A will be described below.

The heat dissipating plate 70 may include a first heat dissipating plate 71 and a second heat dissipating plate 72.

The first heat dissipating plate 71 may be on a bottom surface of the panel protective member 41 or on a bottom surface of the digitizer (not shown). Here, the first heat dissipating plate 71 may have various structures according to whether the display device 1 is folded and the folding type of the display device 1. For example, the display device 1 is not folded, the first heat dissipating plate 71 may be a plate type, the shape of which may not be variable. In an embodiment, in case that the display device 1 is folded, the first heat dissipating plate 71 may include a deformation structure 71-1. The deformation structure 71-1 may have a variable shape or a variable length in case that the display device 1 is folded. The deformation structure 71-1 may have a substantially concavo-convex shape, links connected to one another to be rotatable, for example. In case that folding the display device 1, the deformation structure 71-1 as above may be bent about the bending axis BAX. The deformation structure 71-1 as above may be symmetrical based on the bending axis BAX. A remaining portion of the first heat dissipating plate 71 except for the deformation structure 71-1 may have a substantially plate shape having a substantially flat surface.

The second heat dissipating plate 72 may be on a lower surface of the first heat dissipating plate 71. Here, the second heat dissipating plate 72 may be in contact or direct contact with the first heat dissipating plate 71 or may be connected to the first heat dissipating plate 71 via an adhesive having an excellent thermal transfer efficiency. The second heat dissipating plate 72 may be disconnected. For example, the second heat dissipating plate 72 may be disconnected and separated at a region where the bending axis BAX is provided. The second heat dissipating plate 72 may not interfere with the folding of the display device 1.

The first heat dissipating plate 71 and the second heat dissipating plate 72 may include different materials from each other. For example, the first heat dissipating plate 71 may include graphite, carbon nano-tube, for example, and the second heat dissipating plate 72 may include a metal thin film such as copper, nickel, ferrite, and silver that may shield electromagnetic waves and has excellent heat conduction property.

The shock absorber 90 may be on a bottom surface of the second heat dissipating plate 72. Here, the shock absorber 90 may be only in the first areas 1A. The shock absorber 90 may be disposed on the portion of the display device 1, which is not folded, so as to absorb the shock applied thereto. As described above, in case that the shock is applied to the display device 1, the shock absorber 90 partially absorbs the shock so as to prevent the display panel 50 from being broken or damaged.

Figure 3C:
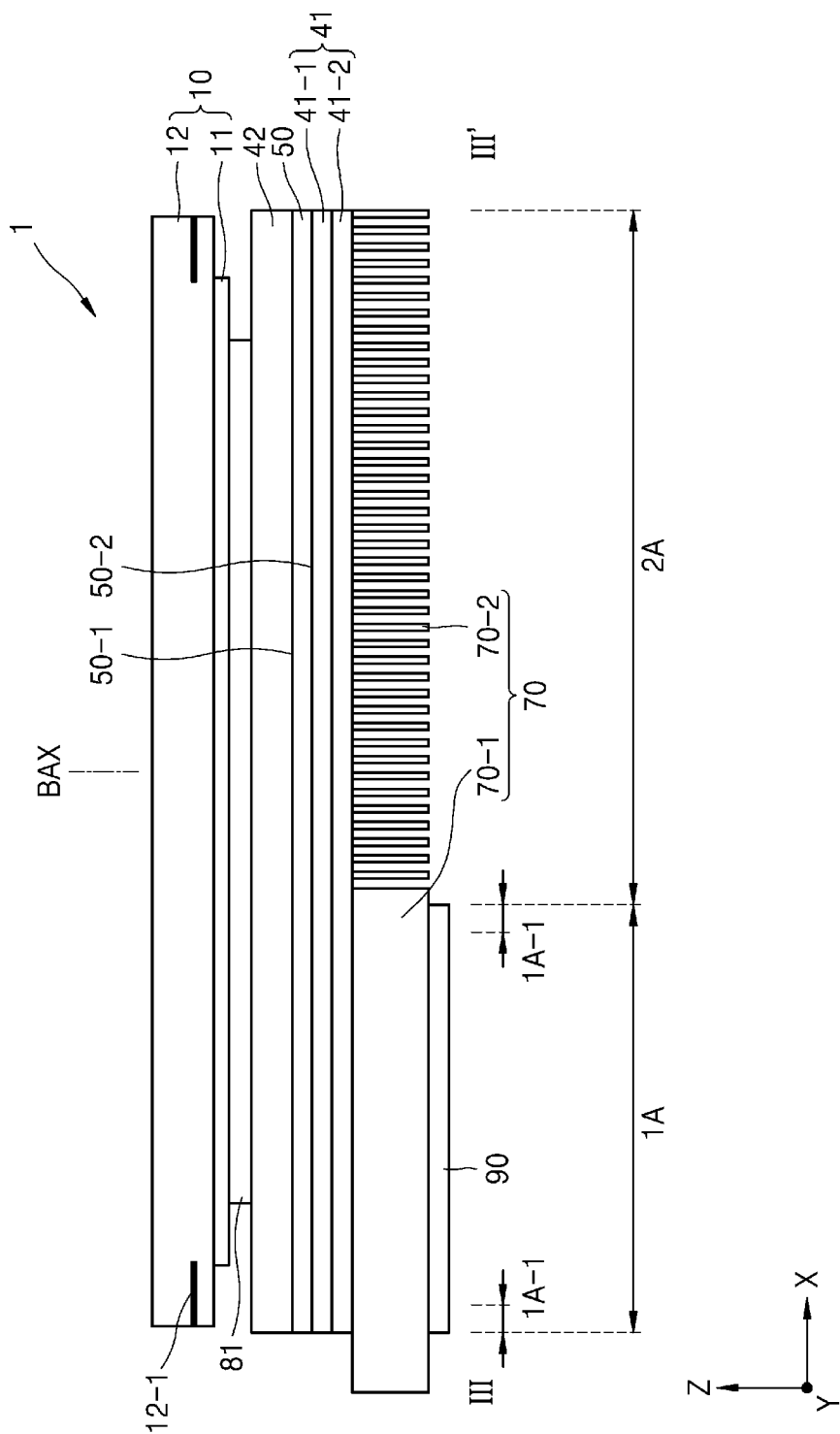
FIG. 3C is a schematic cross-sectional view partially showing a display device taken along line III-III' of FIG. 1 according to an embodiment.

FIG. 3C is a schematic cross-sectional view showing a part of the display device 1 taken along line of FIG. 1 according to an embodiment.

Referring to FIG. 3C, the display device 1 may be similar to that of FIGS. 1 to 3A. Hereinafter, differences from the display device described above with reference to FIGS. 1 to 3A will be described below.

The heat dissipating plate 70 may include a heat dissipating plate body 70-1 in the first area 1A and the deformation structure 70-2 in the second area 2A. Here, the heat dissipating plate body 70-1 may have a substantially flat plate shape. The deformation structure 70-2 may have a structure that does not interfere with the movement of the display device 1 in case that the display device 1 is rolled. For example, the deformation structure 70-2 may include bars separate from one another. In an embodiment, the deformation structure 70-2 may have a shape, in which structures having triangular cross-sections of sharp lower side are connected to one another. Here, the deformation structure 70-2 is not limited thereto, and may include any type of structure that may not interfere with the movement of the display device 1 in case that the second area 2A of the display device 1 is rolled. In an embodiment, although not shown in the drawings, the display device 1 may have a structure, in which second areas 2A are at opposite sides of the first area 1A. The deformation structure 70-2 may be connected to the heat dissipating plate body 70-1 so as to extend from opposite sides of the heat dissipating plate body 70-1. However, an example in which the deformation structure 70-2 is connected to only one or a side of the heat dissipating plate body 70-1 will be described for convenience of description.

In the above case, the shock absorber 90 may be on the heat dissipating plate body 70-1. The shock absorber 90 may correspond to the first area 1A.

In The display device 1 as above, the heat dissipating plate 70 may include the first heat dissipating plate (not shown) and the second heat dissipating plate (not shown) although not shown in the drawing. The heat dissipating plate may have substantially the same shape as that of the heat dissipating plate 70 shown in FIG. 3C, and the second heat dissipating plate may have substantially the same shape as that of the second heat dissipating plate 72 shown in FIG. 3B. The shock absorber 90 may be disposed on a bottom surface of the second heat dissipating plate 72. As described above, in case that the shock is applied to the display device 1, the shock absorber 90 partially absorbs the shock so as to prevent the display panel 50 from being broken or damaged.

Figure 3D:
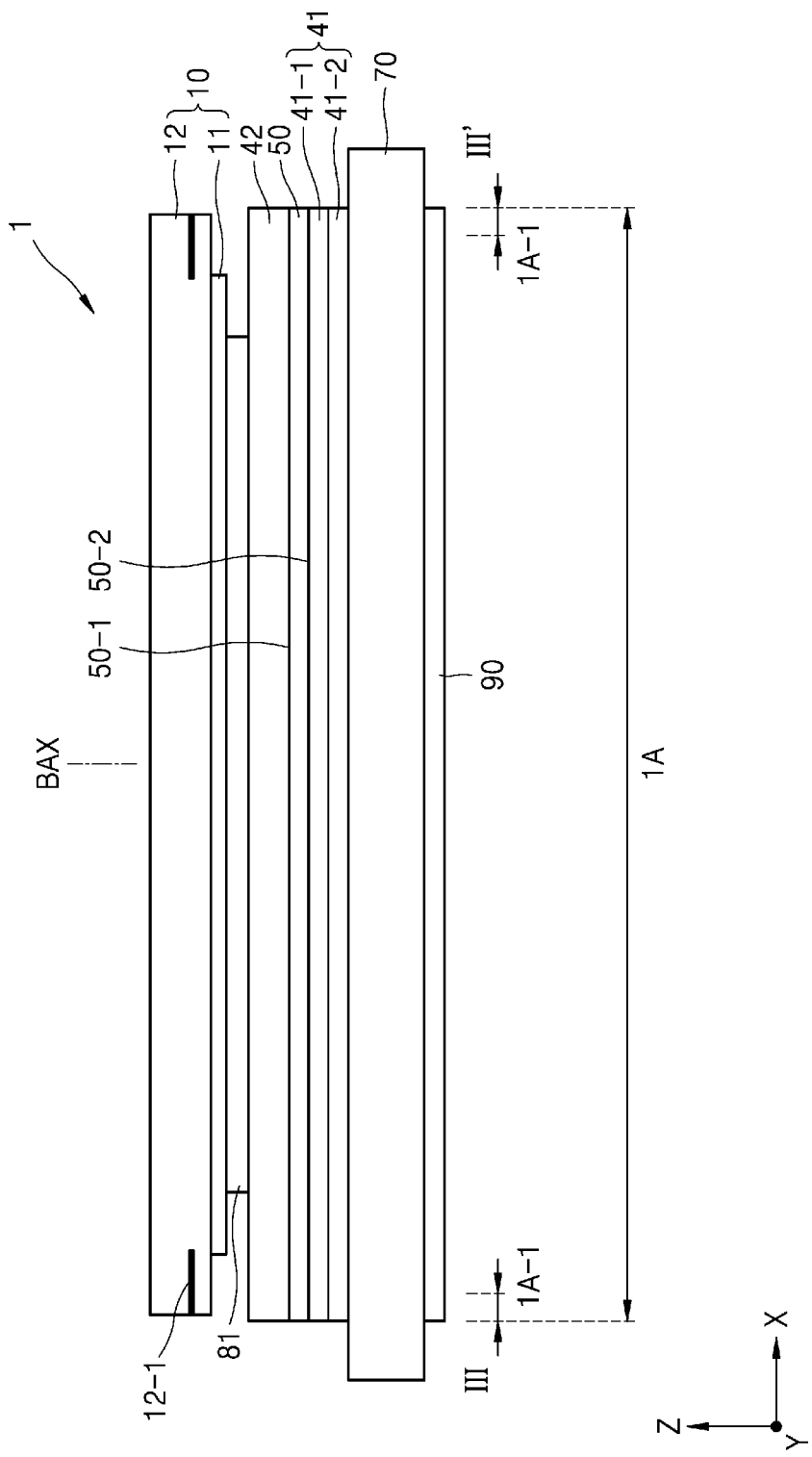
FIG. 3D is a schematic cross-sectional view partially showing a display device taken along line III-III' of FIG. 1 according to an embodiment.

FIG. 3D is a schematic cross-sectional view showing a part of the display device 1 taken along line of FIG. 1 according to an embodiment.

Referring to FIG. 3D, the display device 1 may be similar to that of FIGS. 1 to 3A. Hereinafter, differences from the display device described above with reference to FIGS. 1 to 3A will be described below.

The display device 1 may be in an unfolded state in the above case. For example, the display device 1 may only include the first area 1A.

In the above case, the heat dissipating plate 70 may be on the bottom surface of the display panel 50. The heat dissipating plate 70 may be formed as a plate that is not folded.

In the above case, the shock absorber 90 may be disposed on the bottom surface of the heat dissipating plate 70. There may be one shock absorber 90 corresponding to the first area 1A. In an embodiment, although not shown in the drawings, there may be two or more shock absorbers 90, and the two or more shock absorbers 90 may be spaced apart from each other to correspond to the first areas 1A as shown in FIGS. 3A to 3C. Hereinafter, a case in which there is one shock absorber 90 will be described in detail for convenience of description.

As described above, in case that the shock is applied to the display device 1, the shock absorber 90 partially absorbs the shock so as to prevent the display panel 50 from being broken or damaged.

Figure 4A:
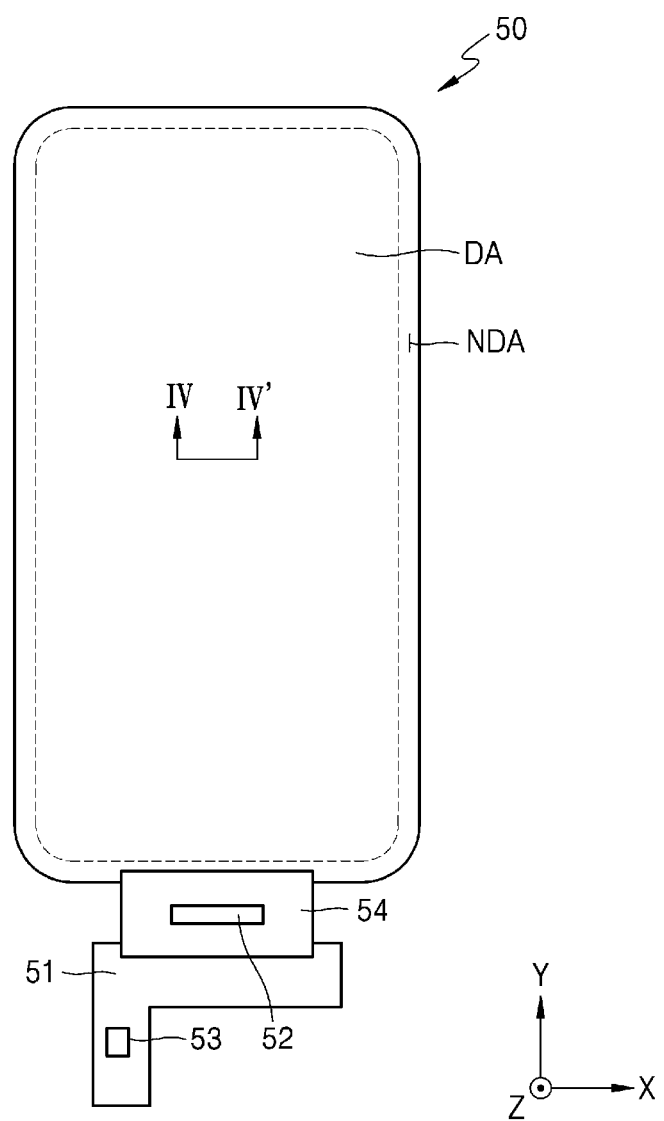
FIG. 4A is a plan view of a display panel according to one or embodiments.
Figure 4B:
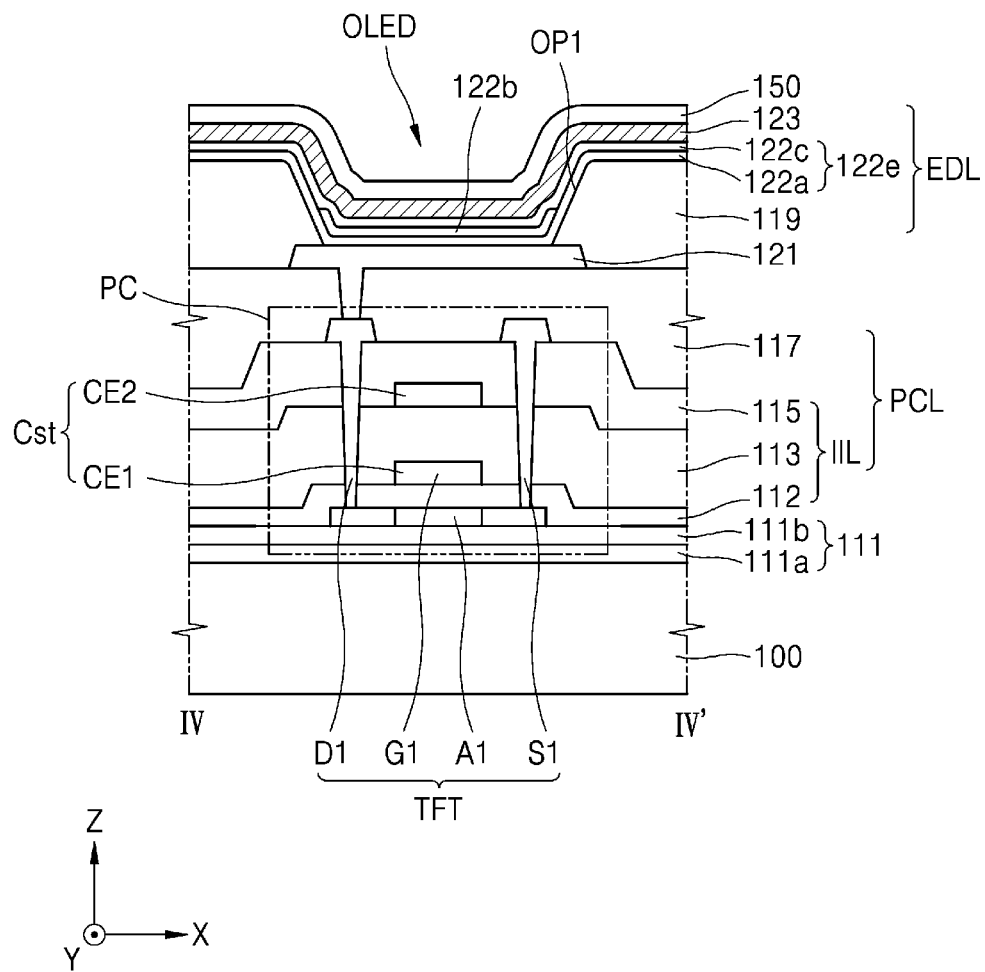
FIG. 4B is a schematic cross-sectional view partially showing the display panel of FIG. 4A taken along line IV-IV' of FIG. 4A.

FIG. 4A is a plan view of the display panel 50 of FIG. 2. FIG. 4B is a schematic cross-sectional view showing a part of the display panel of FIG. 4A taken along line IV-IV' of FIG. 4A.

Referring to FIGS. 4A and 4B, the display panel 50 may include a rigid display panel that is rigid and not easily bent or a flexible display panel that is flexible and may be easily bendable, foldable, and rollable. For example, the display panel 50 may include a foldable display panel, a curved display panel having curved display surface, a bent display panel having bent region other than the display surface, a rollable display panel that is rollable and spreadable, and a stretchable display panel.

The display panel 50 may be transparent so that an object or background disposed under or below the display panel 50 may be seen from above the display panel 50. For example, the display panel 50 may include a reflective display panel that may reflect an object or background above the display panel 50.

A first flexible film 54 may be attached to an edge of the display panel 50. A side of the first flexible film 54 may be attached to one edge of the display panel 50 via an anisotropic conductive film. The first flexible film 54 may be bent.

The display driver 52 may be on the first flexible film 54. The display driver 52 receives control signals and power voltages, and may generate and output signals and voltages for driving the display panel 50. The display driver 52 may include an integrated circuit (IC).

A display circuit board 51 may be attached to an opposite side of the first flexible film 54. The opposite side of the first flexible film 54 may be attached to an upper surface of the display circuit board 51. The display circuit board 51 may include a flexible printed circuit board (FPCB) that is bendable, a rigid printed circuit board (PCB) that is hard and rarely bendable, or a composite printed circuit board including both the rigid PCB and the FPCB.

A touch sensor driver 53 may be on the display circuit board 51. The touch sensor driver 53 may include an integrated circuit. The touch sensor driver 53 may be attached onto the display circuit board 51. The touch sensor driver 53 may be electrically connected to touch electrodes in the touch screen layer of the display panel 50 via the display circuit board 51.

The touch screen layer of the display panel 50 may sense the touch input from the user by using at least one of various touch methods such as a resistive overlay method, a capacitive overlay method, for example. For example, in case that the touch screen layer of the display panel 50 senses the touch input from the user in the capacitive overlay method, the touch sensor driver 53 applies driving signals to driving electrodes among the touch electrodes and senses voltages charged in mutual capacitance between the driving electrodes and sensing electrodes by using the sensing electrodes among the touch electrodes to determine whether there is the touch from the user. The touch of the user may include a touch and a proximity touch. The touch may denote that a finger of the user or an object such as a pen contacts or directly contacts the cover member 10 on the touch screen layer. The proximity touch may denote that the finger of the user or an object such as a pen is close to the cover member 10, but not in direct contact with the cover member 10, for example, hovering. The touch sensor driver 53 transmits sensor data to the main processor according to sensed voltages, and the main processor analyzes the sensor data to calculate a touch coordinate where the touch input occurs.

A power supplier for supplying driving voltages for driving pixels, a scan driver, and the display driver 52 of the display panel 50 may be additionally on the display circuit board 51. For example, the power supplier may be integrated with the display driver 52, and the display driver 52 and the power supplier may be provided as one integrated circuit.

The substrate 100 may include an insulating material, such as glass, quartz, and polymer resin. The substrate 100 may include a rigid substrate or a flexible substrate that may be bendable, foldable, and rollable. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, for example. The substrate may have a multi-layered structure including a layer including the polymer resin stated above and an inorganic layer (not shown). For example, the substrate 100 may include the above two layers including the polymer resin and an inorganic barrier layer provided between the two layers.

The display layer may be on the substrate 100. The display layer may include pixels and may display the image. The display layer may include a circuit layer including thin-film transistors, a display element layer including display elements, and an encapsulation member for encapsulating the display element layer.

The display layer may include the display area DA and the peripheral area NDA. The display area DA may be an area in which the pixels are provided to display images. The peripheral area NDA may be at the outside of the display area DA and may not display images. The peripheral area NDA may surround or be adjacent to the display area DA. The peripheral area NDA may denote an area from the outside of the display area DA to an edge of the display panel 50. The display area DA may include pixel circuits for driving pixels, scan lines electrically connected to the pixel circuits, data lines, power lines, for example, as well as the pixels. The peripheral area NDA may include a scan driver for applying scan signals to the scan lines, fan-out lines electrically connecting the data lines to the display driver, for example.

The touch screen layer may be on the display layer. The touch screen layer may include touch electrodes and may be a layer for sensing whether the user touches. The touch screen layer may be disposed on or directly disposed on the encapsulation member of the display layer. For example, the touch screen layer may be separately formed and may be connected or coupled to the encapsulation member of the display layer via an adhesive layer such as an optically clear adhesive (OCA).

The display panel 50 may include the display area and the peripheral area NDA as described above. Here, sub-pixels are in the display area to realize images, and wires may be in the peripheral area NDA. The display panel 50 may include the substrate 100, a buffer layer 111, a circuit layer PCL, and a display element layer EDL that may be stacked each other.

As described above, the substrate 100 may include an insulating material, such as glass, quartz, and polymer resin. The substrate 100 may include a rigid substrate or a flexible substrate that may be bendable, foldable, and rollable.

A buffer layer 111 is on the substrate 100 to reduce or block infiltration of impurities, moisture, or external air from a lower portion of the substrate 100, and to provide a flat surface on the substrate 100. The buffer layer 111 may include an inorganic material such as an oxide material or a nitride material, an organic material, or an inorganic-organic composite material, and may have a single-layered or multi-layered structure including the inorganic material and the organic material. A barrier layer (not shown) for preventing infiltration of external air may be further provided between the substrate 100 and the buffer layer 111. In an embodiment, the buffer layer 111 may include silicon oxide ($SiO_2$) or silicon nitride ($SiN_x$). The buffer layer 111 may include a first buffer layer 111a and a second buffer layer 111b laminated therein.

The circuit layer PCL may be disposed on the buffer layer 111 and may include the pixel circuits PC, a first gate insulating layer 112, a second gate insulating layer 113, an interlayer insulating layer 115, and a planarization layer 117. The first gate insulating layer 112, the second gate insulating layer 113, and the interlayer insulating layer 115 may be collectively referred to as insulating layers IIL. The pixel circuit PC may include a thin film transistor TFT and a storage capacitor Cst.

The thin film transistor TFT may be disposed on the buffer layer 111. The thin film transistor TFT may include a first semiconductor layer A1, a first gate electrode G1, a first source electrode S1, and a first drain electrode D1. The thin film transistor TFT may be electrically connected to a organic light-emitting diode OLED and may drive the organic light-emitting diode OLED.

The first semiconductor layer A1 is on the buffer layer 111, and may include polysilicon. In an embodiment, the first semiconductor layer A1 may include amorphous silicon. In an embodiment, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel region, and a source region and a drain region doped with impurities.

The first gate insulating layer 112 may cover or overlap the first semiconductor layer A1. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure including the inorganic insulating material.

The first gate electrode G1 is on the first gate insulating layer 112 to overlap the first semiconductor layer A1. The first gate electrode G1 may include molybdenum (Mo), aluminum (Al), copper (Cu), titanium (Ti), for example, and may have a single-layered or multi-layered structure. As an example, the first gate electrode G1 may have a single layer including Mo.

The second gate insulating layer 113 may cover or overlap the first gate electrode G1. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure including the inorganic insulating material.

A first upper electrode CE2 of the storage capacitor Cst may be on the second gate insulating layer 113.

In the display area DA, the first upper electrode CE2 may overlap the first gate electrode G1 arranged or disposed thereunder. The first gate electrode G1 and the first upper electrode CE2 overlapping each other with the second gate insulating layer 113 therebetween may form the storage capacitor Cst. The first gate electrode G1 may be a first lower electrode CE1 of the storage capacitor Cst.

The first upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layered or multi-layered structure.

The interlayer insulating layer 115 may cover or overlap the first upper electrode CE2. The interlayer insulating layer 115 may include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 115 may have a single-layered or a multi-layered structure including the inorganic insulating material.

The first source electrode S1 and the first drain electrode D1 are on the interlayer insulating layer 115. The first source electrode S1 and the first drain electrode D1 may include a conductive material including molybdenum (Mo), aluminum (Al), copper (Cu), titanium (Ti), for example, and may have a single-layered or multi-layered structure including the above materials. For example, the first source electrode S1 and the first drain electrode D1 may each have a multi-layered structure including Ti/Al/Ti.

A planarization layer 117 may cover or overlap the first source electrode S1 and the first drain electrode D1. The planarization layer 117 may have a flat upper surface so that a pixel electrode 121 that is arranged or disposed thereon may be planarized.

The planarization layer 117 may include an organic material or an inorganic material and may have a single-layered or multi-layered structure. The planarization layer 117 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, for example. The planarization layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In case that the planarization layer 117 is formed, after arranging a layer, a chemical and mechanical polishing may be performed on an upper surface of the layer to provide a flat upper surface.

The planarization layer 117 include a via hole that exposes one of the first source electrode S1 and the first drain electrode D1 of the thin film transistor TFT, and the pixel electrode 121 may electrically contact the first source electrode S1 or the first drain electrode D1 via the via hole to be electrically connected to the thin film transistor TFT.

The pixel electrode 121 may include a conductive oxide such as indium tin oxide (ITO), indium zinc oxide (IZO), zinc oxide (ZnO), indium oxide ($In_2O_3$), indium gallium oxide, or aluminum zinc oxide (AZO). The pixel electrode 121 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. For example, the first pixel electrode 121 may have a structure in which films including ITO, IZO, ZnO, or $In_2O_3$ are on or under or below the above-mentioned reflective layer. The pixel electrode 121 may include a stack structure including ITO/Ag/ITO.

The pixel defining layer 119 may include a first opening OP1 that covers or overlaps the edge of the pixel electrode 121 and exposes a center portion of the pixel electrode 121, on the planarization layer 117. A size and a shape of a light-emitting region of the organic light-emitting diode OLED, that is, the sub-pixel, are defined by the first opening OP1.

The pixel defining layer 119 increases a distance between an edge of the pixel electrode 121 and an opposite electrode 123 on the pixel electrode 121 to prevent the generation of an arc at the edge of the pixel electrode 121. The pixel-defining layer 119 may include an organic insulating material such as polyimide, polyamide, acrylic resin, benzocyclobutene, hexamethyldisiloxane (HMDSO), and phenolic resin, and may be formed by spin coating.

A first emission layer 122b is in the first opening OP1 of the pixel defining layer 119, so as to correspond to the pixel electrode 121. The first emission layer 122b may include a polymer material or a low-molecular weight material, and may emit red light, green light, blue light, or white light.

An organic functional layer 122e may be disposed on and/or under or below the first emission layer 122b. The organic functional layer 122e may include a first functional layer 122a and/or a second functional layer 122c. The first functional layer 122a or the second functional layer 122c may be omitted.

The first functional layer 122a may be disposed under or below the first emission layer 122b. The first functional layer 122a may have a single-layered or multi-layered structure including an organic material. The first functional layer 122a may include a hole transport layer (HTL) having a single-layered structure. For example, the first functional layer 122a may include a hole injection layer (HIL) and the HTL. The first functional layer 122a may be integrally provided to correspond to the organic light-emitting diodes OLED in the display area DA.

The second functional layer 122c may be on the first emission layer 122b. The second functional layer 122c may have a single-layered or multi-layered structure including an organic material. The second functional layer 122c may include an electron transport layer (ETL) and/or an electron injection layer (EIL). The second functional layer 122c may be integrally formed to correspond to the organic light-emitting diodes OLED included in the display area DA.

The opposite electrode 123 is on the second functional layer 122c. The opposite electrode 123 may include a conductive material having a low work function. For example, the opposite electrode 123 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. For example, the opposite electrode 123 may further include a layer including ITO, IZO, ZnO, or $In_2O_3$ on the (semi-)transparent layer including the above material. The opposite electrode 123 may be integrally formed to correspond to the organic light-emitting diodes OLED included in the display area DA.

Layers from the pixel electrode 121 to the opposite electrode 123 in the display area DA may form the organic light-emitting diode OLED.

An upper layer 150 including an organic material may be on the opposite electrode 123. The upper layer 150 may be provided to protect the opposite electrode 123 and to improve light extraction efficiency. The upper layer 150 may include an organic material having a higher refractive index than that of the opposite electrode 123. For example, the upper layer 150 may include stacked layers having different refractive indices. For example, the upper layer 150 may include a high refractive index layer or low refractive index layer or high refractive index layer. The high refractive index layer may have a refractive index of about 1.7 or greater and the low refractive index layer may have a refractive index of about 1.3 or less.

The upper layer 150 may additionally include LiF. For example, the upper layer 150 may additionally include an inorganic insulating material such as silicon oxide ($SiO_2$) and silicon nitride ($SiN_x$). The upper layer 150 may be omitted as necessary. However, a case in which the upper layer 150 is on the opposite electrode 123 will be described in detail below for convenience of description.

The display panel 50 may include an encapsulation member (not shown) for shielding the upper layer 150, although not shown in the drawings. In an embodiment, the encapsulation member may include an encapsulation substrate (not shown) facing the substrate 100 and a sealing member (not shown) between the substrate 100 and the encapsulation substrate for shielding a space between the substrate 100 and the encapsulation substrate against outside.

In an embodiment, the encapsulation member may include a thin film encapsulation layer. The thin film encapsulation layer may be in contact or direct contact with the upper layer 150 on the upper layer 150. Here, the thin film encapsulation layer may partially cover or overlap the display area DA and the peripheral area NDA, in order to prevent infiltration of external moisture and oxygen. The thin film encapsulation layer may include at least one organic encapsulation layer and at least one inorganic encapsulation layer. Hereinafter, a case in which the thin film encapsulation layer may include a first inorganic encapsulation layer, an organic encapsulation layer, and a second inorganic encapsulation layer sequentially stacked each other on the upper layer 150 will be described in detail for convenience of description.

In the above case, the first inorganic encapsulation layer covers or overlaps the opposite electrode 123 and may include silicon oxide, silicon nitride, and/or silicon oxynitride. The first inorganic encapsulation layer is formed along a structure thereunder, and thus, the first inorganic encapsulation layer has an uneven upper surface. The organic encapsulation layer covers or overlaps the first inorganic encapsulation layer, and unlike the first inorganic encapsulation layer, the organic encapsulation layer may have a flat upper surface. In detail, the organic encapsulation layer may planarize the upper surface of a portion corresponding to the display area DA. The organic encapsulation layer may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer covers or overlaps the organic encapsulation layer and may include silicon oxide, silicon nitride, and/or silicon oxynitride.

The touch screen layer may be on the encapsulation member.

Figure 5A:
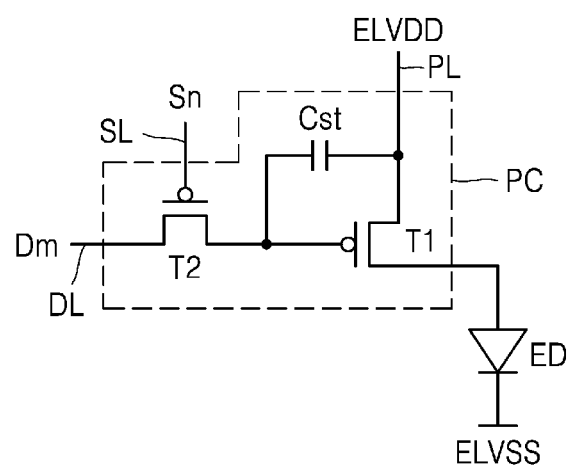
FIG. 5A and FIG. 5B are equivalent circuit diagrams of a pixel circuit driving a sub-pixel in the display panel of FIG. 4A and FIG. 4B.
Figure 5B:
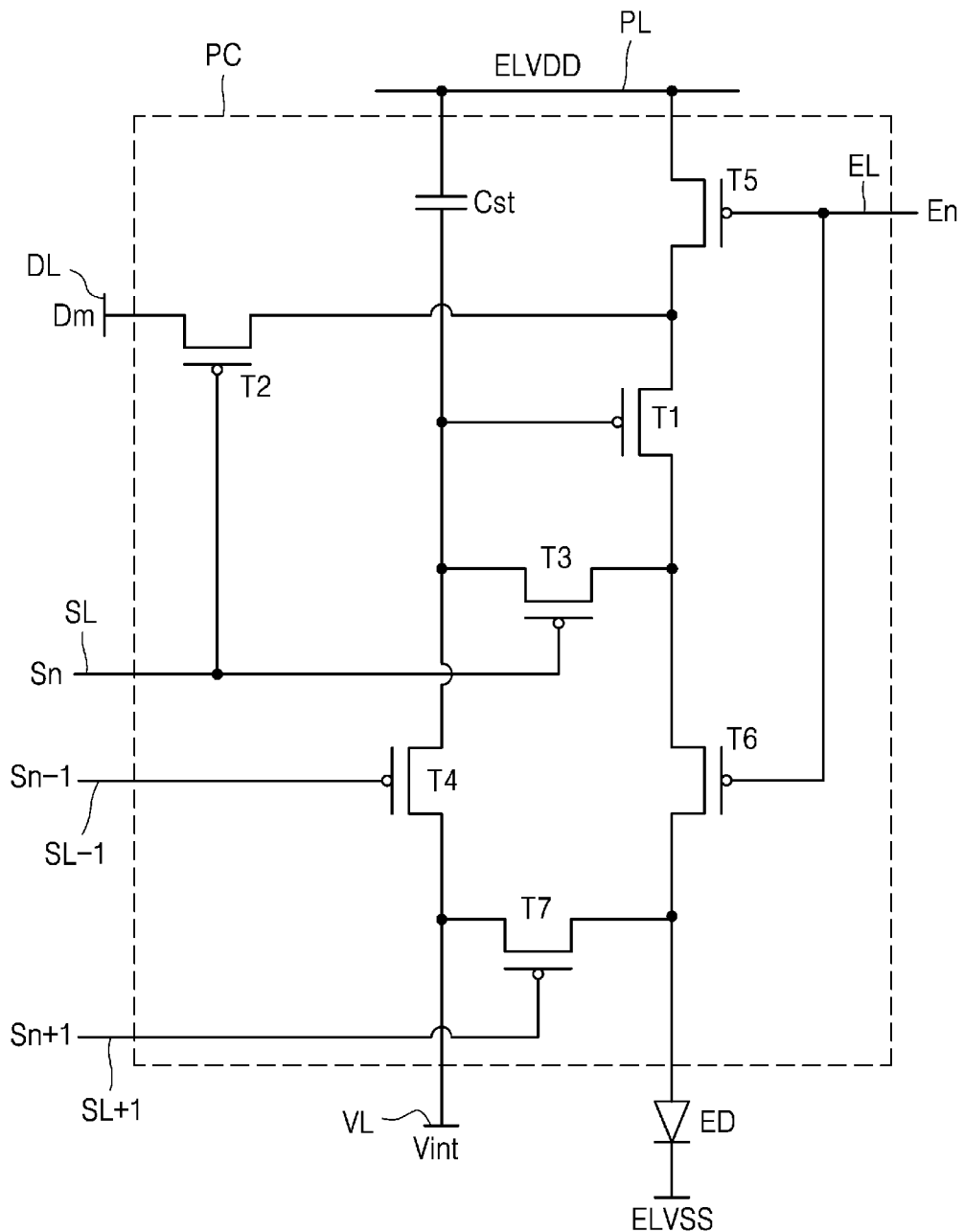

FIG. 5A and FIG. 5B are equivalent circuit diagrams of the pixel circuit PC driving a sub-pixel in the display panel 50 of FIG. 4A and FIG. 4B.

Referring to FIGS. 5A and 5B, the pixel circuit PC may be electrically connected to a light-emitting element ED to realize light emission from sub-pixels. The pixel circuit PC may include a driving thin film transistor T1, a switching thin film transistor T2, and a storage capacitor Cst. The switching TFT T2 may be electrically connected to the scan line SL and the data line DL and transfers a data signal Dm input through the data line DL to the driving TFT T1 according to a scan signal Sn input through the scan line SL.

The storage capacitor Cst may be electrically connected to the switching thin film transistor T2 and a driving voltage line PL and stores a voltage corresponding to a difference between a voltage transferred from the switching thin film transistor T2 and a driving voltage ELVDD supplied to the driving voltage line PL.

The driving thin film transistor T1 may be electrically connected to the driving voltage line PL and the storage capacitor Cst and may control a driving current flowing from the driving voltage line PL to the light-emitting element ED in response to the voltage value stored in the storage capacitor Cst. The light-emitting element ED may emit light having a predetermined luminance according to the driving current.

FIG. 5A shows an example in which the pixel circuit PC may include two thin-film transistors and one storage capacitor, but one or more embodiments are not limited thereto.

Referring to FIG. 5B, the pixel circuit PC may include the driving thin film transistor T1, the switching thin film transistor T2, a compensating thin film transistor T3, a first initialization thin film transistor T4, an operation control thin film transistor T5, an emission control thin film transistor T6, and a second initialization thin film transistor T7.

In FIG. 5B, every pixel circuit PC may include signal lines SL, SL−1, SL+1, EL, DL, an initialization voltage line VL, and the driving voltage line PL, but one or more embodiments are not limited thereto. In an embodiment, at least one of the signal lines SL, SL−1, SL+1, EL, and DL, and/or the initialization voltage line VL may be shared by neighboring pixel circuits.

A drain electrode of the driving thin film transistor T1 may be electrically connected to the light-emitting element ED via the emission control thin film transistor T6. The driving thin film transistor T1 receives the data signal Dm according to a switching operation of the switching thin film transistor T2 to supply a driving current to the light-emitting element ED.

A gate electrode of the switching thin film transistor T2 may be electrically connected to the scan line SL, and a source electrode of the switching thin film transistor T2 may be electrically connected to the data line DL. A drain electrode of the switching thin film transistor T2 may be electrically connected to a source electrode of the driving thin film transistor T1, and at the same time, may be electrically connected to the driving voltage line PL via the operation control thin film transistor T5.

The switching thin film transistor T2 may be turned on according to a scan signal Sn received through the scan line SL and performs a switching operation for transferring the data signal Dm transferred through the data line DL to the source electrode of the driving thin film transistor T1.

A gate electrode of the compensation thin film transistor T3 may be electrically connected to the scan line SL. A source electrode of the compensation thin film transistor T3 may be electrically connected to the drain electrode of the driving thin film transistor T1, and at the same time, may be electrically connected to a pixel electrode of the light-emitting element ED via the emission control thin film transistor T6. A drain electrode of the compensating thin film transistor T3 may be electrically connected to one electrode of the storage capacitor Cst, together with the source electrode of the first initialization thin film transistor T4 and the gate electrode of the driving thin film transistor T1. The compensation thin film transistor T3 may be turned on according to the scan signal Sn transferred through the scan line SL, and electrically connects the gate electrode and the drain electrode of the driving thin film transistor T1 to each other for diode-connecting the driving thin film transistor T1.

A gate electrode of the first initialization thin film transistor T4 may be electrically connected to the previous scan line SL−1. The drain electrode of the first initialization thin film transistor T4 may be electrically connected to the initialization voltage line VL. A source electrode of the first initialization thin film transistor T4 may be electrically connected to one electrode of the storage capacitor Cst, together with the drain electrode of the compensating thin film transistor T3 and the gate electrode of the driving thin film transistor T1. The first initialization TFT T4 is turned on according to a scan signal Sn−1 transferred through the previous scan line SL−1 to transfer an initialization voltage Vint to the gate electrode of the driving thin film transistor T1 and perform an initialization operation for initializing a voltage at the gate electrode of the driving thin film transistor T1.

A gate electrode of the operation control thin film transistor T5 may be electrically connected to the emission control line EL. A source electrode of the operation control thin film transistor T5 may be electrically connected to the driving voltage line PL. A drain electrode of the operation control thin film transistor T5 may be electrically connected to the source electrode of the driving thin film transistor T1 and the drain electrode of the switching thin film transistor T2.

A gate electrode of the emission control thin film transistor T6 may be electrically connected to the emission control line EL. A source electrode of the emission control thin film transistor T6 may be electrically connected to the drain electrode of the driving thin film transistor T1 and the source electrode of the compensation thin film transistor T3. A drain electrode of the emission control thin film transistor T6 may be electrically connected to the pixel electrode of the light-emitting element ED. The operation control thin film transistor T5 and the emission control thin film transistor T6 are simultaneously turned on according to an emission control signal En transferred through the emission control line EL to transfer the driving voltage ELVDD to the light-emitting element ED, and a driving current flows through the light-emitting element ED.

The gate electrode of the second initialization thin film transistor T7 may be electrically connected to a post scan line SL+1. A source electrode of the second initialization thin film transistor T7 may be electrically connected to the pixel electrode of the light-emitting element ED. A drain electrode of the second initialization thin film transistor T7 may be electrically connected to the initialization voltage line VL. The second initialization thin-film transistor T7 is turned on according to a post scan signal Sn+1 transferred through the post scan line SL+1 to initialize the pixel electrode of the light-emitting element ED.

FIG. 5B shows an example, in which the first initialization thin film transistor T4 and the second initialization thin film transistor T7 are respectively electrically connected to the previous scan line SL−1 and the post scan line SL+1, but one or more embodiments are not limited thereto. In an embodiment, the first initialization thin film transistor T4 and the second initialization thin film transistor T7 may be both electrically connected to the previous scan line SL−1 to be operated according to the previous scan signal Sn−1.

Another electrode of the storage capacitor Cst may be electrically connected to the driving voltage line PL. One electrode of the storage capacitor Cst may be electrically connected to the gate electrode of the driving thin film transistor T1, the drain electrode of the compensating thin film transistor T3, and the source electrode of the first initialization thin film transistor T4.

An opposite electrode (for example, a cathode) of the light-emitting element ED may receive a supply of the common voltage ELVSS. The light-emitting element ED emits light after receiving a driving current from the driving thin film transistor T1.

The pixel circuit PC is not limited to the number and circuit design of the thin film transistors and the storage capacitor illustrated with reference to FIGS. 5A and 5B, and the number and the circuit design may vary.

Figure 6A:
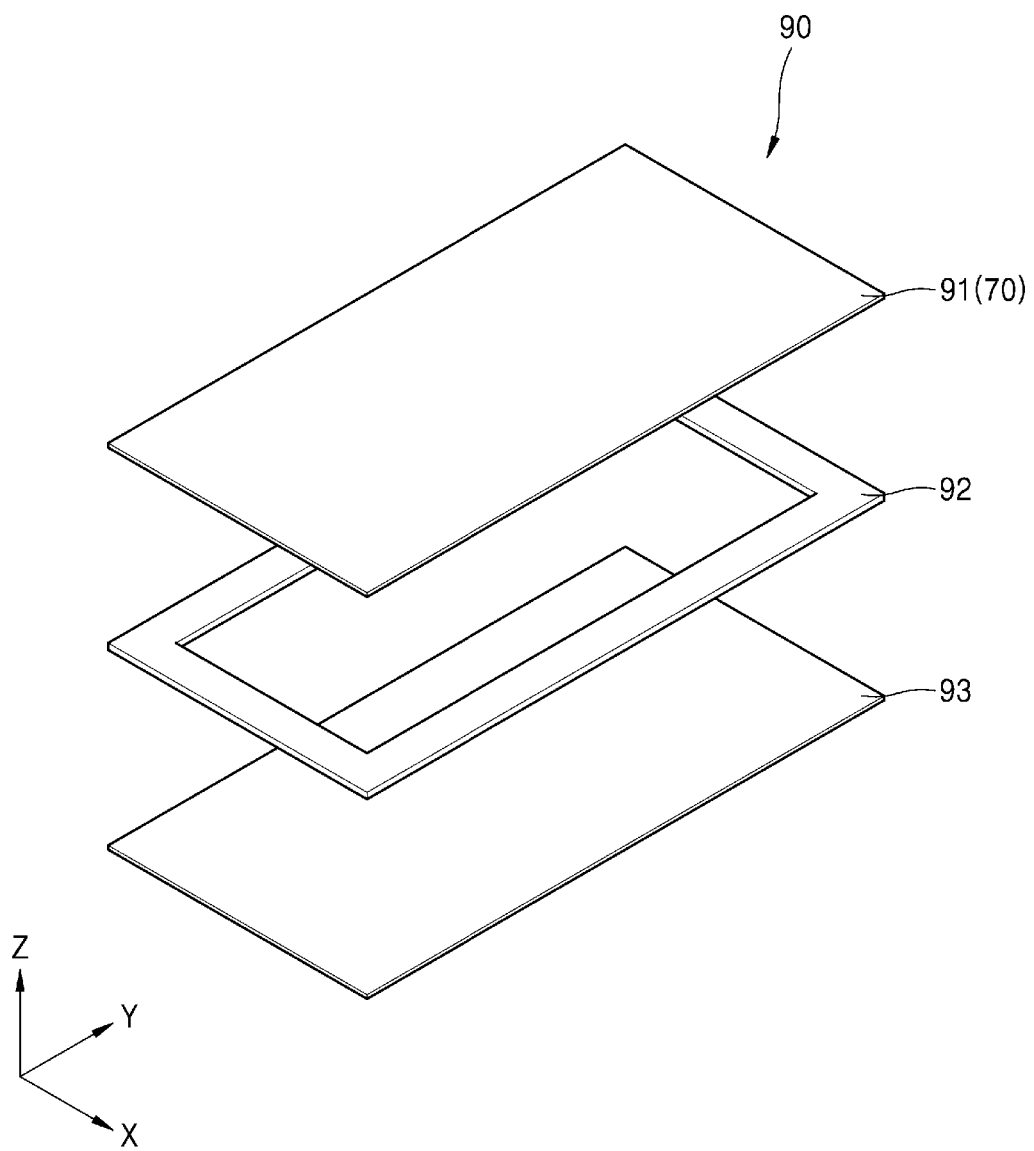
FIG. 6A is a perspective view of a shock absorber according to an embodiment.
Figure 6B:
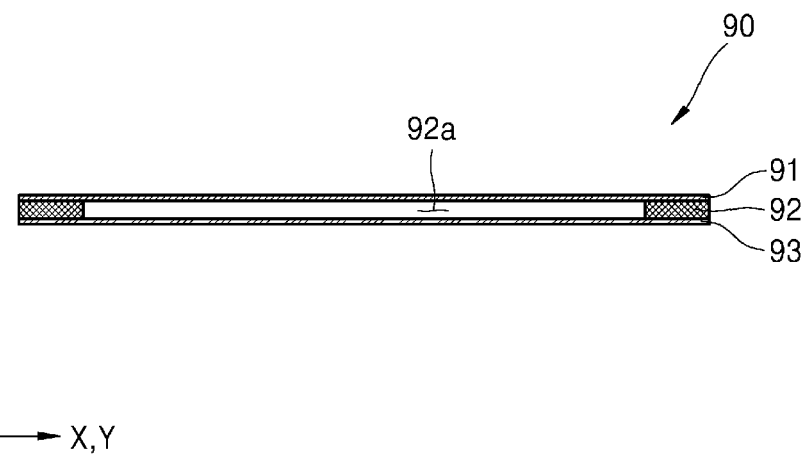
FIG. 6B is a schematic cross-sectional view of the shock absorber of FIG. 6A.

FIG. 6A is a perspective view of the shock absorber 90 according to an embodiment. FIG. 6B is a schematic cross-sectional view of the shock absorber 90 of FIG. 6A.

Referring to FIGS. 6A and 6B, the shock absorber 90 may be disposed on a surface of the heat dissipating plate 70. For example, the shock absorber 90 may include a first member 91, a second member 92, and a third member 93.

The first member 91 may be disposed on a surface of the heat dissipating plate 70. The first member 91 may include the same material or similar material as that of the heat dissipating plate 70 and may be integrally provided with the heat dissipating plate 70. In an embodiment, the first member 91 may include the same material or similar material as that of the heat dissipating plate 70 and may be formed to be separable from the heat dissipating plate 70 and then connected or coupled to the heat dissipating plate 70. In an embodiment, the first member 91 may include a different material from that of the heat dissipating plate 70 and may be separated from the heat dissipating plate 70. The first member 91 may include at least one from metal, carbon fiber reinforced plastic (CFRP), glass, and ceramic. The first member 91 may have a substantially plate shape and may substantially correspond to a part of the first area 1A or the entire portion of the first area 1A. Hereinafter, a case in which the first member 91 may include a different material from that of the heat dissipating plate 70 and may be separated from the heat dissipating plate 70 will be described in detail for convenience of description.

The first member 91 may be on a bottom surface of the heat dissipating plate 70 that is in the first area 1A, in case that there is one heat dissipating plate 70. In case that the heat dissipating plate 70 may include the first heat dissipating plate (not shown) and the second heat dissipating plate (not shown) as shown in FIGS. 3B and 3C, the heat dissipating plate 70 may be on a bottom surface of the second heat dissipating plate. There may be a plurality of first members 91, and the plurality of first members 91 may be separated from one another.

The second member 92 may be on a bottom surface of the first member 91. Here, the second member 92 may protrude from the first member 91 in a direction away from the display panel 50. The second member 92 may include an empty center portion, but may have a substantially loop shape having a space 92a at the center. In an embodiment, the second member 92 may have a substantially plate shape having no space therein. In an embodiment, the second member 92 may have a substantially bar shape, and a plurality of second members 92 may be provided to be separate from one another. In the above case, the second member 92 may include at least one of polyethylene terephthalate and metal. Here, the second member 92 may include a material having elasticity to some degree, and may be connected to the first member 91 via welding or via an adhesive. Hereinafter, a case in which the second member 92 is bonded to the first member 91 and has a substantially closed-loop shape having an empty center will be described in detail for convenience of description.

The second member 92 as above may correspond to edges of the first area 1A (for example, 1A-1 of FIGS. 3A to 3D). For example, the second member 92 does not support the center portion of the first area 1A, but may support the boundary region of the first area 1A (for example, 1A-1 of FIGS. 3A to 3D). There may be the space 92a on the bottom surface at the center of the first area 1A due to the second member 92. Also, at least a part of the second member 92 may be on a lower surface of the peripheral area NDA that is in the first area 1A.

The third member 93 may be arranged or disposed facing the first member 91 and may be connected or coupled to the second member 92. The third member 93 may have a substantially plate shape, and the first member 91, the second member 92, and the third member 93 may completely shield the center portion of the second member 92 against the outside. Here, the third member 93 may have a substantially thin plate shape including at least one of a metal and a synthetic resin.

The shock absorber 90 as above may endure the force applied thereto from outside to some extent. In detail, in case that the shock is applied from outside, the first member 91 or the third member 93 are pulled into the space 92a formed in the shock absorber 90 at the center of the first area 1A to absorb the shock. Also, in case that the shock is applied to a portion where the second member 92 is located or disposed, the shock may be partially absorbed by the second member 92 due to its elasticity.

Moreover, the third member 93 may block the other components (for example, the circuit board, devices on the circuit board, the protrusion of the lower cover, etc.) on the bottom surface of the third member 92 from entering the space 92a in the shock absorber 90, and thus, damage to the first member 91 may be prevented. The third member 93 may prevent the deformed space of the first member 91 from being narrowed due to the other components.

Figure 7:
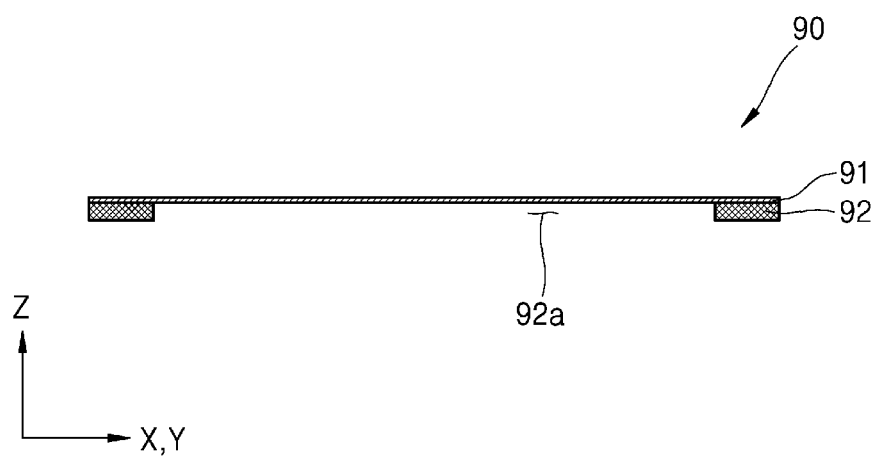
FIG. 7 is a schematic cross-sectional view of a shock absorber according to an embodiment.

FIG. 7 is a schematic cross-sectional view of the shock absorber 90 according to an embodiment.

Referring to FIG. 7, the shock absorber 90 may include the first member 91 and the second member 92. Here, the second member 92 may include the space 92a at the center thereof. In an embodiment, the second member 92 may have a substantially bar shape, and a pair of second members 92 may be provided on the bottom surface of the first member 91 to be separated from each other. A pair of second members 92 may be arranged or disposed in parallel with each other such that the bottom surface of the first member 91 between the second members 92 may be spaced apart from the bottom surface of the second members 92. The pair of second members 92 may be located or disposed at outermost boundary portions of the first member 91.

In the above case, the second members 92 may be supported by being in contact with the lower cover (not shown) or the circuit board. The second members 92 may separate the bottom surface of the first member 91 from one or a surface of the lower cover or the circuit board.

In the above case, the shock absorber 90 ensures a space deformed with the display panel 50 with respect to the impact applied from the upper surface of the first member 91, and thus, the impact applied to the display panel 50 may be reduced or absorbed.

Also, with respect to the impact applied from the surface of the lower cover or the surface of the circuit board, the space 92a that accommodates the deformation of the lower cover or the circuit board may be provided to prevent the impact from being directly transferred to the display panel 50.

Figure 8A:
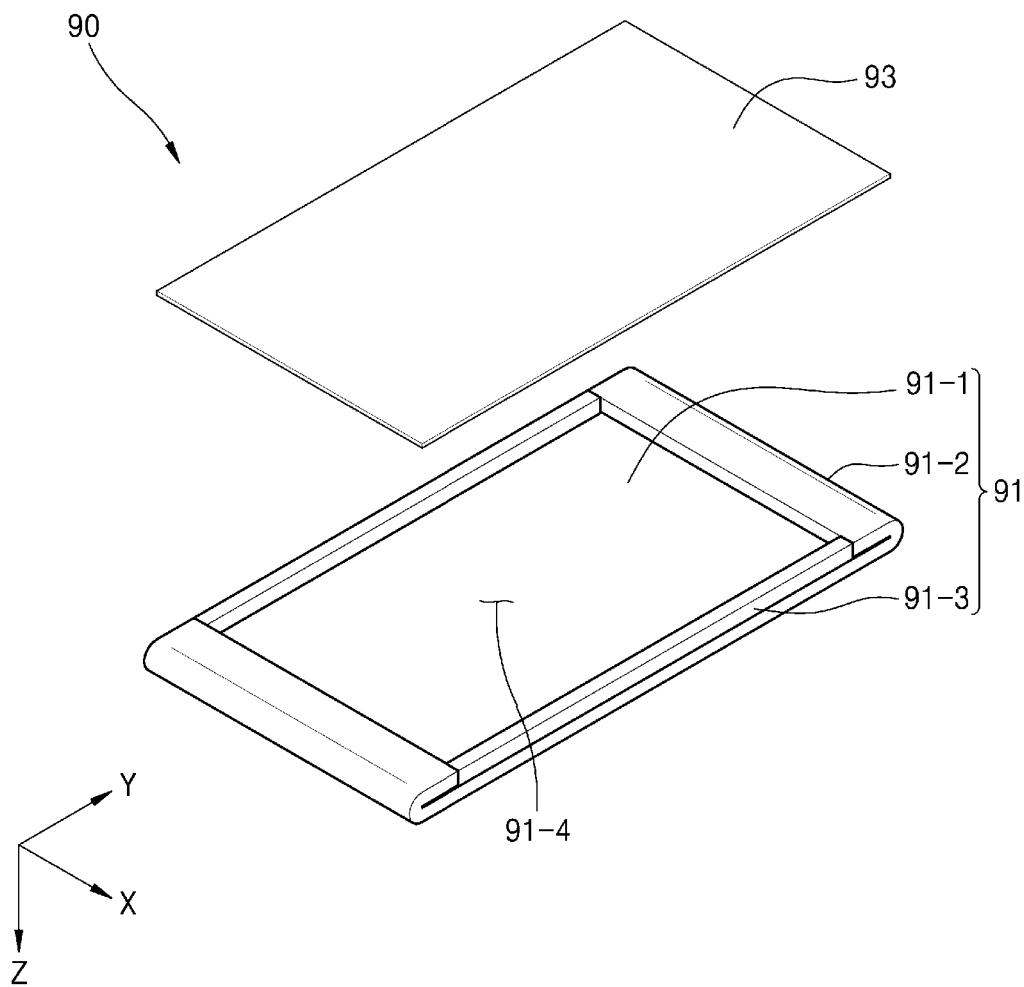
FIG. 8A is a perspective view of a shock absorber according to an embodiment.
Figure 8B:
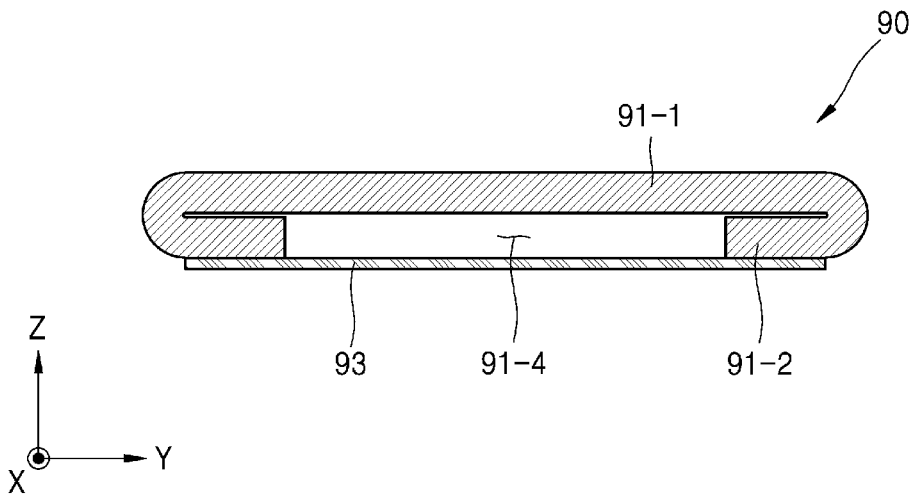
FIG. 8B is a schematic cross-sectional view of the shock absorber of FIG. 8A.

FIG. 8A is a perspective view of the shock absorber 90 according to an embodiment. FIG. 8B is a schematic cross-sectional view of the shock absorber 90 of FIG. 8A.

Referring to FIGS. 8A and 8B, the shock absorber 90 may include the first member 91 and the third member 93.

Here, the first member 91 may have a boundary that is bent. In detail, the first member 91 may include a first member body 91-1 of a substantially plate shape, a first side portion 91-2 bent from the first member body 91-1, and a second side portion 91-3 bent from the first member body 91-1 and arranged or disposed or located in a different direction from the first side portion 91-2.

In the above case, the first side portion 91-2 may face a bottom surface of the first member body 91-1. The first side portion 91-2 may be bent from the first member body 91-1. An upper surface of the first side portion 91-2 may be spaced apart from the bottom surface of the first member body 91-1. The second side portion 91-3 may be bent from the first member body 91-1 and may protrude toward the third member 93. The first member 91 may have a space or aperture or cavity 91-4 therein.

The third member 93 may be provided as a substantially plate shape connected or coupled to the first member 91. Here, the first member 91 and the third member 93 may include the same material or similar material as or different materials from each other. The first member 91 and the third member 93 may be connected or coupled to each other via an adhesive or via welding.

The shock absorber 90 may operate similarly to the above description. Here, in case that the impact is applied from outside, the shock absorber 90 may absorb the impact via the elasticity generated by the shapes of the first side portion 91-2 and the first member body 91-1. Also, the shock absorber 90 may include the space 91-4 to provide a space to be deformed in case that the first member body 91-1 and the third member 93 are deformed.

Therefore, in case that various impacts are applied to the display device, the shock absorber 90 may reduce the shock applied to the display panel 50.

Figure 9A:
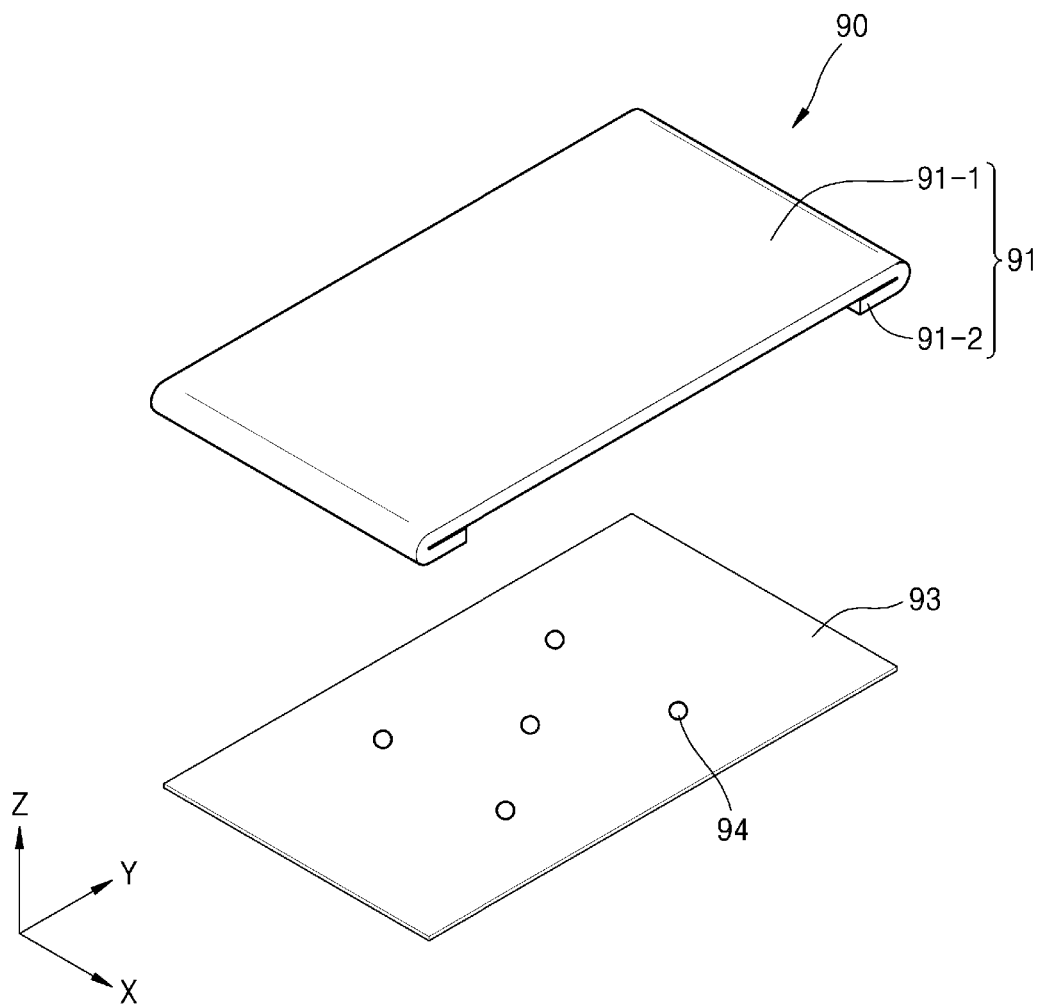
FIG. 9A is a perspective view of a shock absorber according to an embodiment.
Figure 9B:
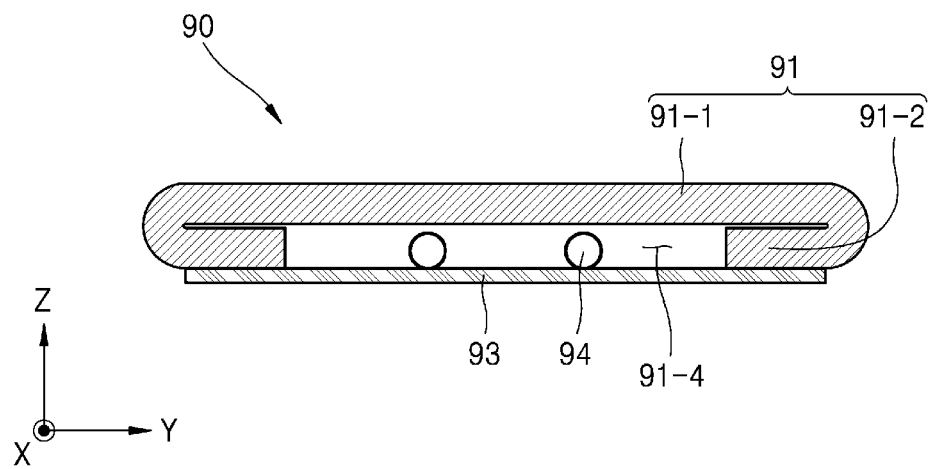
FIG. 9B is a schematic cross-sectional view of the shock absorber of FIG. 9A.

FIG. 9A is a perspective view of the shock absorber 90 according to an embodiment. FIG. 9B is a schematic cross-sectional view of the shock absorber 90 of FIG. 9A.

Referring to FIGS. 9A and 9B, the shock absorber 90 may include the first member 91, the third member 93, and a spacer 94. The third member 93 is the same as or similar to that described above with reference to FIGS. 8A and 8B, and detailed descriptions thereof are omitted.

The first member 91 may include the first member body 91-1 and the first side portion 91-2. Here, the first member body 91-1 and the first side portion 91-2 are the same as or similar to those of FIGS. 8A and 8B, and thus detailed descriptions thereof are omitted.

In the above case, the first member 91 may have sides that are partially open. Also, the first member body 91-1 may be spaced apart from the third member 93 due to the first side portion 91-2, and the space 91-4 may be generated between the first member body 91-1 and the third member 93. The space 91-4 may communicate with the outside.

The spacer 94 may be in the space 91-4 of the shock absorber 90. The spacer 94 may have a substantially hemispherical shape, a part of a substantially elliptical shape, or a substantially spherical shape. There may be a plurality of spacers 94, and the plurality of spacers 94 may be spaced apart from one another. In an embodiment, in case that there is one spacer 94, the spacer 94 may be at a point of the bottom surface of the first member body 91-1.

The spacer 94 may be fixed on at least one of the bottom surface of the first member body 91-1 and the third member 93. For example, the spacer 94 may be fixed only on the bottom surface of the first member body 91-1. In an embodiment, the spacer 94 may be fixed only on an upper surface of the third member 93. In an embodiment, the spacer 94 may be fixed on the bottom surface of the first member body 91-1 and the upper surface of the third member 93.

The spacer 94 may include an elastic material such as rubber, silicon, synthetic resin, soft metal, for example.

Although not shown in the drawings, the shock absorber 90 may include the first member 91, the second member 92, the third member 93, and the spacer 94. The spacer 94 may be in the shock absorber 90 having the shape as shown in FIG. 6A.

Although not shown in the drawings, the shock absorber 90 may include the first member 91, the second member 92, and the spacer 94. The spacer 94 may be on the bottom surface of the first member 91 in the shock absorber 90 having the shape as shown in FIG. 7.

Figure 9C:
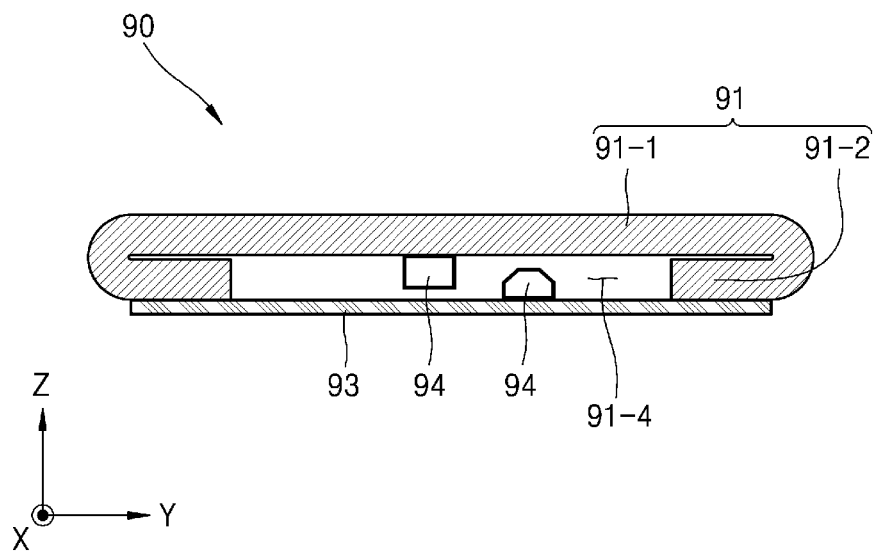
FIG. 9C is a schematic cross-sectional view of a shock absorber according to an embodiment.

FIG. 9C is a schematic cross-sectional view of the shock absorber 90 according to an embodiment.

Referring to FIG. 9C, the shock absorber 90 may include the first member 91, the third member 93, and a spacer 94. Here, the first member 91 and the third member 93 are the same as or similar to those of FIGS. 9A and 9B, detailed descriptions thereof are omitted.

The spacer 94 may have a similar shape as that of FIGS. 9A and 9B. Here, the spacer 94 may have a substantially polygonal pillar shape. In an embodiment, the spacer 94 may have a substantially polypyramid shape.

In the above case, the spacer 94 may have a cross-section that is in parallel with a height direction of the shock absorber 90 (for example, z-axis direction of FIG. 9C), wherein the cross-section may have a substantially polygonal shape such as a substantially triangular shape, a substantially quadrangular shape, a substantially trapezoidal shape, for example.

Figure 10:
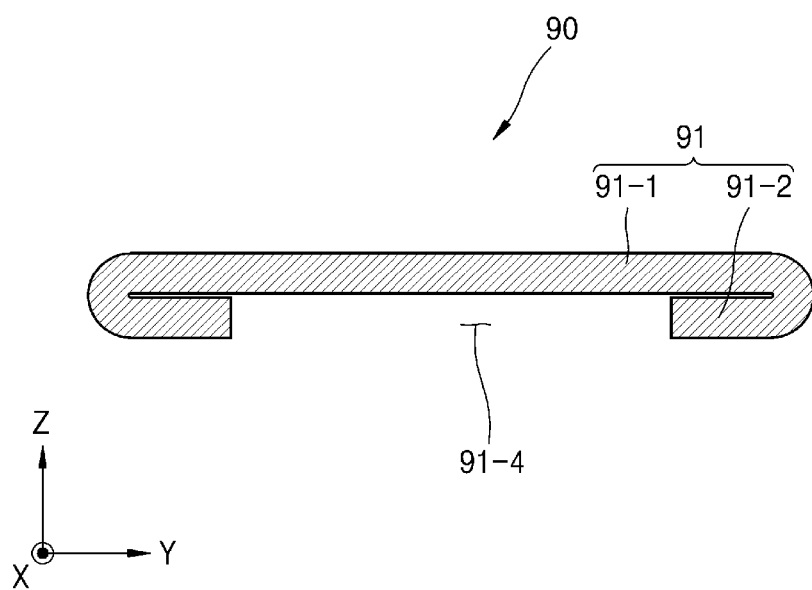
FIG. 10 is a schematic cross-sectional view of a shock absorber according to an embodiment.

FIG. 10 is a schematic cross-sectional view of the shock absorber 90 according to an embodiment.

Referring to FIG. 10, the shock absorber 90 may include the first member 91. Here, the first member 91 may be the same as or similar to the shape shown in FIG. 8A or 9A. Hereinafter, a case in which the first member 91 is the same as that of FIG. 9A will be described in detail below for convenience of description.

In the above case, the shock absorber 90 may absorb the shock applied from outside via the first member body 91-1 and the first side portion 91-2. In detail, the shock applied from the outside may be transferred from the front surface or the rear surface of the display device 1 to the shock absorber 90. In case that the shock is applied from the front surface of the display device 1, the shock is transferred to the first member body 91-1 and may be absorbed by the deformation of the first member body 91-1 or variation in the interval between the first member body 91-1 and the first side portion 91-2. Also, the shock transferred from the rear surface of the display device 1 may be absorbed by the variation in the interval between the first member body 91-1 and the first side portion 91-2 or the variation in a part of the rear surface of the display device 1.

Therefore, the shock absorber 90 may effectively reduce the shock applied from outside to the display device 1.

Figure 11:
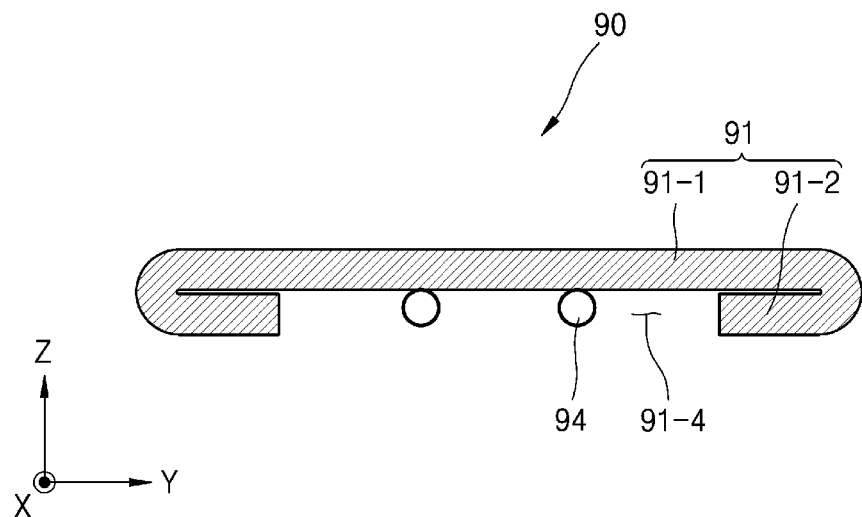
FIG. 11 is a schematic cross-sectional view of a shock absorber according to an embodiment.

FIG. 11 is a schematic cross-sectional view of the shock absorber 90 according to an embodiment.

Referring to FIG. 11, the shock absorber 90 may include the first member 91 and the spacer 94. Here, the first member 91 may be the same as or similar to that of FIGS. 8A to 9C. The spacer 94 may be the same as or similar to that of FIGS. 9A to 9C. Hereinafter, a case in which the first member 91 is the same as that of FIG. 8A will be described in detail for convenience of description.

The spacer 94 may protrude from the bottom surface of the first member body 91-1. Here, at least one spacer 94 may be provided. Although not shown in the drawings, in case that there is one spacer 94, the spacer 94 may be on the bottom surface of the first member body 91-1 at a portion where the first side portion 91-2 does not exist. However, a case in which there are a plurality of spacers 94 will be described in detail for convenience of description.

In case that there are the spacers 94, the spacers 94 may prevent excessive deformation of the first member body 91-1. For example, in case that the shock is applied from outside, excessive deformation of the first member body 91-1 may cause excessive bending of a given portion in the display panel 50, and thus, the spacers 94 may prevent damage to the display panel 50.

Figure 12:
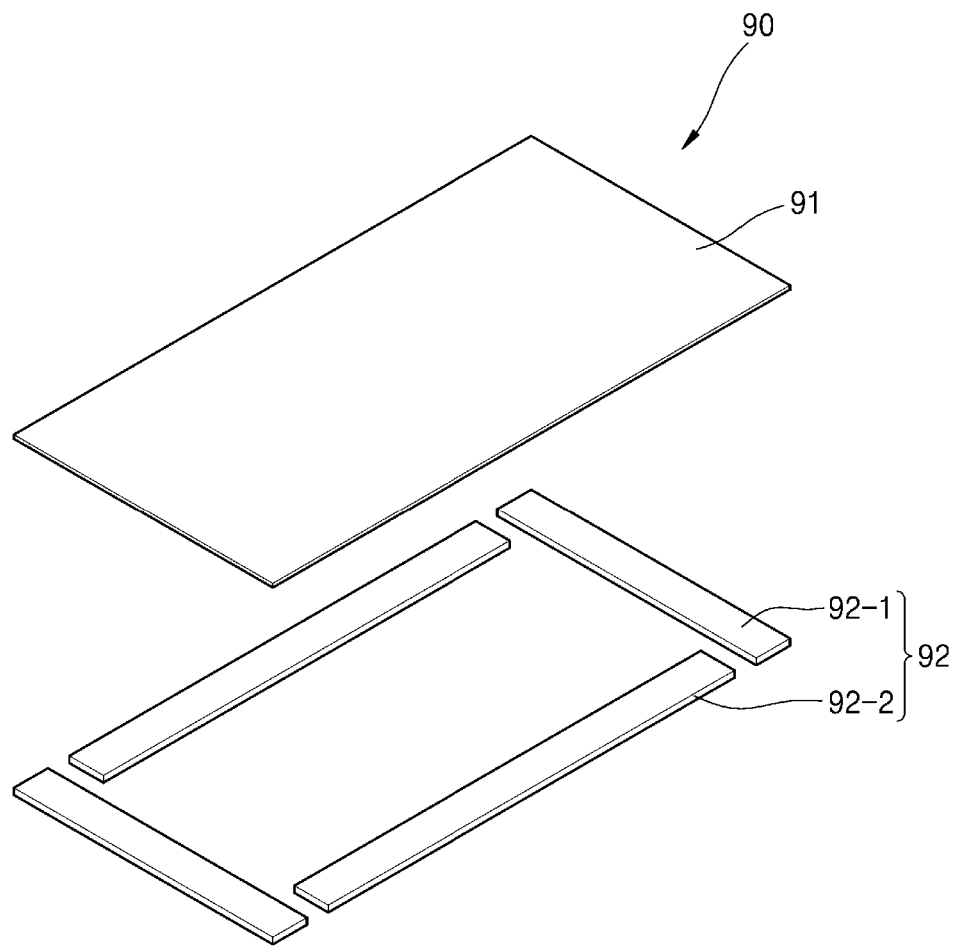
FIG. 12 is a perspective view of a shock absorber according to an embodiment.

FIG. 12 is a perspective view of the shock absorber 90 according to an embodiment.

Referring to FIG. 12, the shock absorber 90 may include the first member 91 and the second member 92. Here, the first member 91 may have the substantially plate shape as described above with reference to FIGS. 6A and 6B.

A plurality of second members 92 may be provided. Here, the second member 92 may have a substantially bar shape, and the plurality of second members 92 may be separated from each other. The second members 92 adjacent to each other are not connected to, but separated from each other, and in case that each of the second members is fixed on the first member 91, the second members 92 may not be connected to one another. The second members 92 may maintain the separate state from one another. The second member 92 may include a first side member 92-1 arranged or disposed in a first direction (for example, one of x-axis and y-axis directions in FIG. 12) and a second side member 92-2 arranged or disposed in a second direction (for example, the other of the x-axis direction and the y-axis direction in FIG. 12). An end of the first side member 92-1 may be separated from a side surface of the second side member 92-2. Also, there may be a plurality of first side members 92-1 and a plurality of second side members 92-2 that are separated from one another as described above.

In the above case, the first member 91 may be deformed within a given range without being constrained by the second members 92.

Therefore, the shock absorber 90 may effectively reduce the shock applied from outside, and may protect the display panel 50.

Although not shown in the drawings, with regard to the shape of the second member 92, the shape of the second member 92 may be applied to the embodiments shown in FIGS. 6A to 7.

The display device according to one or more embodiments may not break or may not be damaged in case that colliding with an object. Also, the display device according to one or more embodiments may perform normal operations even in case that there is a collision. The display device according to one or more embodiments may effectively absorb an external shock through a structure or structures described herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a display panel including a first area of a constant shape; and
    at least one shock absorber located on a surface of the first area of the display panel, the at least one shock absorber supporting the display panel,
    wherein the at least one shock absorber comprises:
        a first member located on the first area of the display panel; and
        a second member facing the first member, the second member being connected to the first member and disposed only on a part of the first member.

2. The display device of claim 1, further comprising a heat dissipating plate disposed between the at least one shock absorber and the display panel.

3. The display device of claim 2, wherein the heat dissipating plate and the first member of the at least one shock absorber are integral with each other.

4. The display device of claim 2, wherein the heat dissipating plate comprises:
    a first heat dissipating plate disposed on a surface of the display panel; and
    a plurality of second heat dissipating plates spaced apart from one another and disposed on the first heat dissipating plate.

5. The display device of claim 4, wherein
    the at least one shock absorber includes a plurality of shock absorbers, and
    the plurality of shock absorbers respectively correspond to the plurality of second heat dissipating plates.

6. The display device of claim 4, wherein the first heat dissipating plate comprises a deformation structure at a bending portion of the display panel.

7. The display device of claim 1, wherein the at least one shock absorber further comprises a third member facing the first member and the second member, the third member being connected to the second member.

8. The display device of claim 1, wherein the at least one shock absorber further comprises a spacer disposed on a surface of the first member.

9. The display device of claim 1, wherein the second member is a closed loop in a plan view.

10. The display device of claim 1, wherein
the second member and the first member are integral with each other, and
the second member is bent from the first member.

11. The display device of claim 10, wherein a surface of the first member is spaced apart from a surface of the second member.

12. The display device of claim 1, wherein the second member comprises:
a first side member located in a first direction; and
a second side member spaced apart from the first side member and located in a second direction.

13. A display device comprising:
a display panel;
a heat dissipating plate disposed on a surface of the display panel and connected to the display panel; and
a shock absorber facing the display panel with the heat dissipating plate disposed between the shock absorber and the display panel, the shock absorber being disposed on a surface of the heat dissipating plate, wherein the surface of the heat dissipating plate is different from another surface of the heat dissipating plate connected to the display panel.

14. The display device of claim 13, further comprising a panel protective member disposed between the heat dissipating plate and the display panel.

15. The display device of claim 13, further comprising an optical functional layer disposed on the display panel.

16. The display device of claim 13, further comprising a cover member disposed on the display panel.

17. The display device of claim 13, wherein the heat dissipating plate comprises:
a first heat dissipating plate connected to the display panel; and
a second heat dissipating plate that is disconnected and separated at a region of a bending axis of the display device to be connected to the first heat dissipating plate.

18. The display device of claim 13, wherein the heat dissipating plate includes a deformation structure that is folded or unfolded.

19. The display device of claim 18, wherein the shock absorber does not overlap the deformation structure of the heat dissipating plate.

20. The display device of claim 13, wherein the shock absorber further comprises:
a first member located on a first area of the display panel; and
a second member facing the display panel the first member, the second member being connected to the first member and disposed on a part of the first member.

21. A display device comprising:
a display panel comprising:
an unfolded first area; and
a second area connected to the first area, the second area being foldable or rollable;
a heat dissipating plate connected to the display panel, the heat dissipating plate comprising:
a portion corresponding to the unfolded first area; and
a deformation structure corresponding to the second area; and
a shock absorber located on the portion of the heat dissipating plate corresponding to the unfolded first area.

22. The display device of claim 21, wherein
the unfolded first area includes two first areas spaced apart from each other with the second area disposed between the two first areas, and
the shock absorber is disconnected and correspond to the two first areas of the unfolded first area.

23. The display device of claim 21, wherein the shock absorber includes a portion corresponding to a boundary of the unfolded first area, the portion of the shock absorber protruding in a direction away from the display panel.

24. The display device of claim 21, wherein the shock absorber includes a space in the shock absorber.

25. The display device of claim 21, wherein the heat dissipating plate comprises:
a first heat dissipating plate connected to the display panel; and
a second heat dissipating plate that is disconnected and separated at a region of a bending axis of the display device to be connected to the first heat dissipating plate.

26. The display device of claim 21, further comprising a panel protective member disposed between the heat dissipating plate and the display panel.

27. The display device of claim 21, further comprising a cover member disposed on the display panel.

* * * * *